(12) United States Patent
Liao et al.

(10) Patent No.: US 11,532,519 B2
(45) Date of Patent: Dec. 20, 2022

(54) SEMICONDUCTOR DEVICE AND METHOD

(71) Applicant: Taiwan Semiconductor Manufacturing Co., Ltd., Hsinchu (TW)

(72) Inventors: Yi-Bo Liao, Hsinchu (TW); Kai-Chieh Yang, Kaohsiung (TW); Ching-Wei Tsai, Hsinchu (TW); Kuan-Lun Cheng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 67 days.

(21) Appl. No.: 17/340,660

(22) Filed: Jun. 7, 2021

(65) Prior Publication Data
US 2021/0313235 A1 Oct. 7, 2021

Related U.S. Application Data

(63) Continuation of application No. 16/504,786, filed on Jul. 8, 2019, now Pat. No. 11,031,298.
(Continued)

(51) Int. Cl.
*H01L 21/8238* (2006.01)
*H01L 29/06* (2006.01)
(Continued)

(52) U.S. Cl.
CPC .............. *H01L 21/823807* (2013.01); *H01L 21/02532* (2013.01); *H01L 21/02603* (2013.01);
(Continued)

(58) Field of Classification Search
CPC ....... H01L 21/823807; H01L 21/02532; H01L 21/02603; H01L 21/28088;
(Continued)

(56) References Cited

U.S. PATENT DOCUMENTS 9,209,247 B2 12/2015 Colinge et al.
9,224,833 B2 12/2015 Chen et al.
(Continued)

FOREIGN PATENT DOCUMENTS

KR 101838279 B1 3/2018

*Primary Examiner* — Karen Kusumakar
*Assistant Examiner* — Adam S Bowen
(74) *Attorney, Agent, or Firm* — Slater Matsil, LLP

(57) ABSTRACT

In an embodiment, a method includes: forming a first recess and a second recess in a substrate; growing a first epitaxial material stack in the first recess, the first epitaxial material stack including alternating layers of a first semiconductor material and a second semiconductor material, the layers of the first epitaxial material stack being undoped; growing a second epitaxial material stack in the second recess, the second epitaxial material stack including alternating layers of the first semiconductor material and the second semiconductor material, a first subset of the second epitaxial material stack being undoped, a second subset of the second epitaxial material stack being doped; patterning the first epitaxial material stack and the second epitaxial material stack to respectively form first nanowires and second nanowires; and forming a first gate structure around the first nanowires and a second gate structure around the second nanowires.

20 Claims, 26 Drawing Sheets

Related U.S. Application Data

(60) Provisional application No. 62/773,346, filed on Nov. 30, 2018.

(51) Int. Cl.

| | | |
|---|---|---|
| *H01L 29/423* | (2006.01) | |
| *H01L 29/49* | (2006.01) | |
| *H01L 29/786* | (2006.01) | |
| *H01L 29/66* | (2006.01) | |
| *H01L 21/02* | (2006.01) | |
| *H01L 21/28* | (2006.01) | |
| *H01L 21/306* | (2006.01) | |
| *H01L 21/3065* | (2006.01) | |
| *H01L 27/092* | (2006.01) | |

(52) U.S. Cl.
CPC .... *H01L 21/28088* (2013.01); *H01L 21/3065* (2013.01); *H01L 21/30625* (2013.01); *H01L 21/823842* (2013.01); *H01L 27/092* (2013.01); *H01L 29/0673* (2013.01); *H01L 29/42392* (2013.01); *H01L 29/4908* (2013.01); *H01L 29/4966* (2013.01); *H01L 29/66545* (2013.01); *H01L 29/78651* (2013.01); *H01L 29/78684* (2013.01); *H01L 29/78696* (2013.01)

(58) Field of Classification Search
CPC ........... H01L 21/30625; H01L 21/3065; H01L 21/823842; H01L 27/092; H01L 29/0673; H01L 29/42392
See application file for complete search history.

(56) References Cited

U.S. PATENT DOCUMENTS

| | | | |
|---|---|---|---|
| 9,251,888 | B1 | 2/2016 | Liaw |
| 9,865,681 | B1* | 1/2018 | Wu .................... H01L 21/02181 |
| 10,243,054 | B1* | 3/2019 | Cheng .................... H01L 27/088 |
| 2014/0091360 | A1 | 4/2014 | Pillarisetty et al. |
| 2015/0048442 | A1 | 2/2015 | Colinge et al. |
| 2015/0303270 | A1 | 10/2015 | Liaw |
| 2015/0348796 | A1* | 12/2015 | Fu ....................... H01L 21/3086 |
| | | | 257/329 |
| 2016/0027929 | A1 | 1/2016 | Cheng et al. |
| 2016/0225868 | A1 | 8/2016 | Kim et al. |
| 2017/0005195 | A1 | 1/2017 | Ching et al. |
| 2017/0154973 | A1 | 6/2017 | Ching et al. |
| 2017/0194213 | A1 | 7/2017 | Ching et al. |
| 2017/0221708 | A1 | 8/2017 | Bergendahl et al. |
| 2017/0256611 | A1 | 9/2017 | Kim et al. |
| 2018/0102359 | A1* | 4/2018 | Cheng ................. H01L 27/0629 |
| 2019/0131417 | A1* | 5/2019 | Hong ................. H01L 29/66545 |
| 2019/0341314 | A1 | 11/2019 | Ando et al. |
| 2019/0393351 | A1 | 12/2019 | Beattie et al. |
| 2020/0020690 | A1 | 1/2020 | Ando et al. |

* cited by examiner

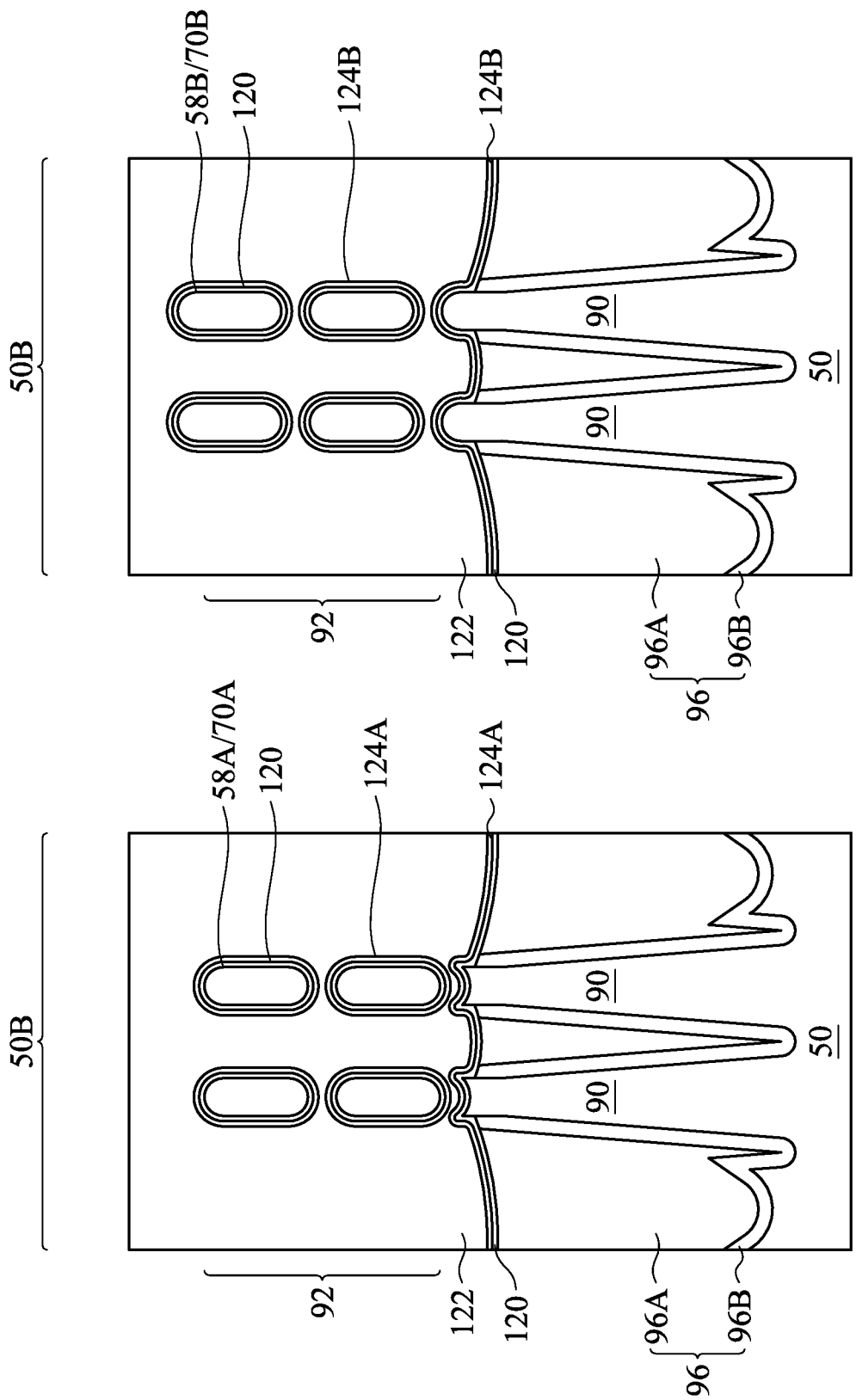

SEMICONDUCTOR DEVICE AND METHOD

PRIORITY CLAIM AND CROSS-REFERENCE

This application is a continuation of U.S. patent application Ser. No. 16/504,786, filed on Jul. 8, 2019, entitled "Semiconductor Device and Method," which claims the benefit of U.S. Provisional Application No. 62/773,346, filed on Nov. 30, 2018, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 25A through 25C are various views of intermediate stages in the manufacturing of GAA FETs, in accordance with some other embodiments.

DETAILED DESCRIPTION

Figure 1:
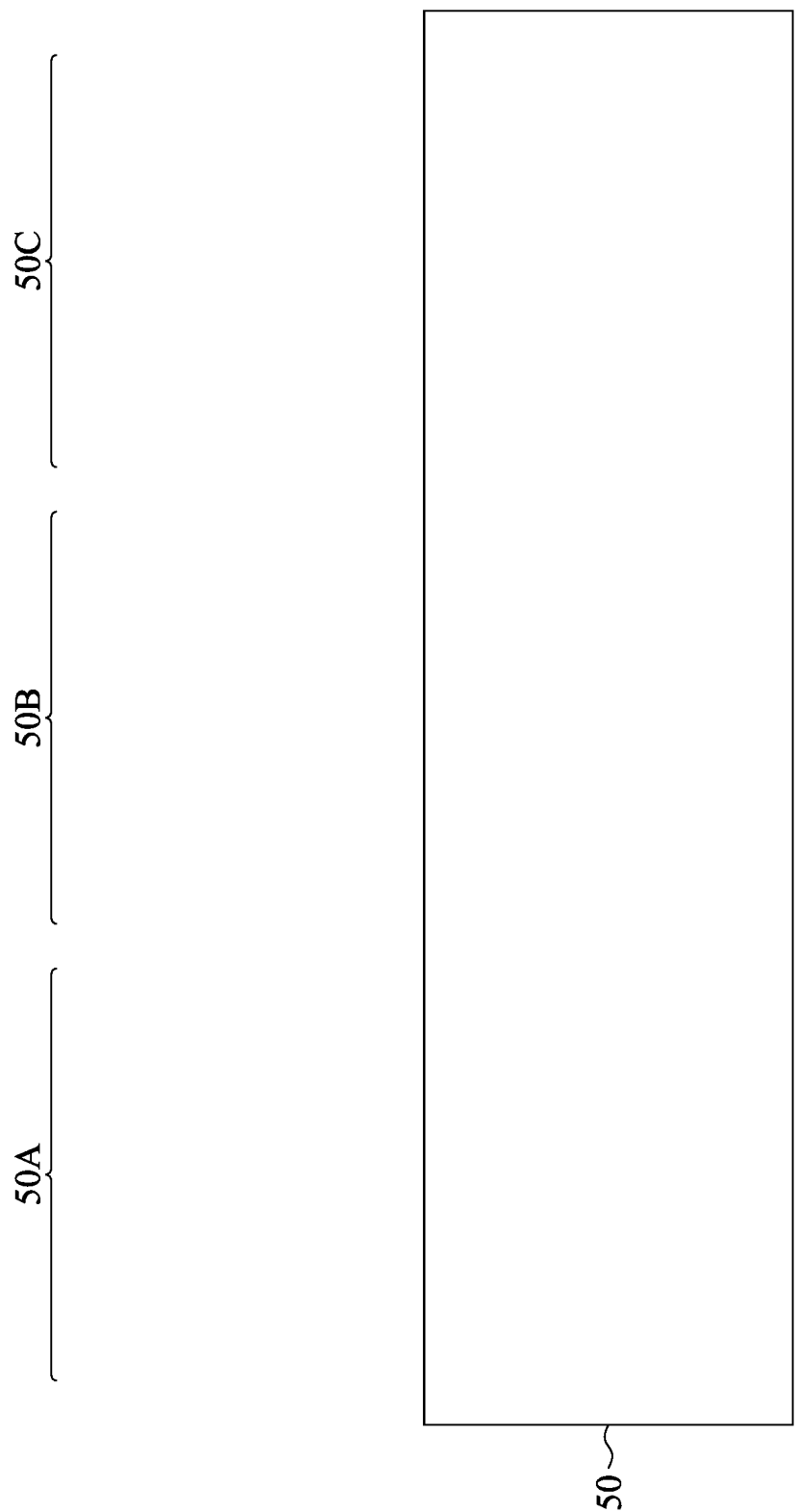
FIGS. 1 through 24 are various views of intermediate stages in the manufacturing of gate-all-around (GAA) field-effect transistors (FETs), in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a plurality of epitaxial material stacks are formed in a substrate. The epitaxial material stacks are doped during growth, and have different average impurity concentrations. The epitaxial material stacks are then patterned to form nanowires for gate-all-around (GAA) field-effect transistors (FETs). The average impurity concentration of the nanowires for each GAA FET determines the threshold voltage for the GAA FET. Devices with multiple threshold voltages may thus be formed on a same substrate.

FIGS. 1 through 12 are cross-sectional views of intermediate stages in the manufacturing of GAA FETs, in accordance with some embodiments. GAA FETs having different threshold voltages are manufactured in different regions of a same device. The threshold voltage of a FET is the minimum gate-to-source voltage needed to create a conducting path between the source and drain terminal of the FET.

In FIG. 1, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has regions 50A, 50B, and 50C. The regions 50A, 50B, and 50C can be for forming n-type devices, such as NMOS transistors, e.g., n-type GAA FETs, or can be for forming p-type devices, such as PMOS transistors, e.g., p-type GAA FETs. The regions 50A, 50B, and 50C may be physically separated from one another, and any number of device features (e.g., other active devices, doped regions, isolation structures, etc.) may be disposed between the regions 50A, 50B, and 50C. As discussed further below, epitaxial material stacks will be formed in the regions 50A, 50B, and 50C. The epitaxial material stacks will be patterned to form GAA FETs in the regions 50A, 50B, and 50C. Although one epitaxial material stack is illustrated in each region, it should be appreciated that the regions 50A, 50B, and 50C may include multiple epitaxial material stacks.

The GAA FETs formed in the regions 50A, 50B, and 50C have different threshold voltages. In particular, GAA FETs having a first threshold voltage $V_1$ are formed in the region 50A, GAA FETs having a greater second threshold voltage $V_2$ are formed in the region 50B, and GAA FETs having an even greater third threshold voltage $V_3$ are formed in the region 50C. Further, n-type GAA FETs or p-type GAA FETs may be formed in the regions 50A, 50B, and 50C. The n-type GAA FETs and p-type GAA FETs are formed using different work function materials in their gate electrodes. As a result, GAA FETs with six possible threshold voltages (e.g., three for the n-type GAA FETs and three for the p-type GAA FETs) may be formed on the substrate 50.

Further, appropriate wells (not shown) may be formed in the substrate 50. In some embodiments, p-type wells are formed in regions where n-type GAA FETs are formed (e.g., NMOS regions), and n-type wells are formed in regions where p-type GAA FETs are formed (e.g., PMOS regions). Different implant steps may be used to form n-type wells and p-type wells.

In the embodiments with different well types, the different implant steps for the NMOS regions and the PMOS regions may be achieved using a photoresist or other masks (not shown). For example, a photoresist may be formed over the substrate 50 and patterned to expose PMOS regions of the substrate 50. The photoresist can be formed by using a spin-on technique and can be patterned using acceptable photolithography techniques. Once the photoresist is patterned, an n-type impurity implant is performed in the PMOS regions, and the photoresist may act as a mask to substantially prevent n-type impurities from being implanted into the NMOS region. The n-type impurities may be phosphorus, arsenic, antimony, or the like implanted in the region to a concentration of equal to or less than $10^{18}$ cm$^{-3}$, such as between about $10^{17}$ cm$^{-3}$ and about $10^{18}$ cm$^{-3}$. After the implant, the photoresist may be removed, such as by an acceptable ashing process.

Following the implanting of the PMOS regions, a photoresist is formed over the substrate 50 and patterned to expose NMOS regions of the substrate 50. The photoresist can be formed by using a spin-on technique and can be patterned using acceptable photolithography techniques. Once the photoresist is patterned, a p-type impurity implant may be performed in the NMOS regions, and the photoresist may act as a mask to substantially prevent p-type impurities from being implanted into the PMOS regions. The p-type impurities may be boron, BF$_2$, indium, or the like implanted in the region to a concentration of equal to or less than $10^{18}$ cm$^{-3}$, such as between about $10^{17}$ cm$^{-3}$ and about $10^{18}$ cm$^{-3}$. After the implant, the photoresist may be removed, such as by an acceptable ashing process.

After the implants of the NMOS and PMOS regions of the substrate 50, an anneal may be performed to activate the p-type and/or n-type impurities that were implanted. In some embodiments, the substrate 50 is epitaxially grown and in situ doped during growth, which may obviate the implantations, although in situ and implantation doping may be used together.

Figure 2:
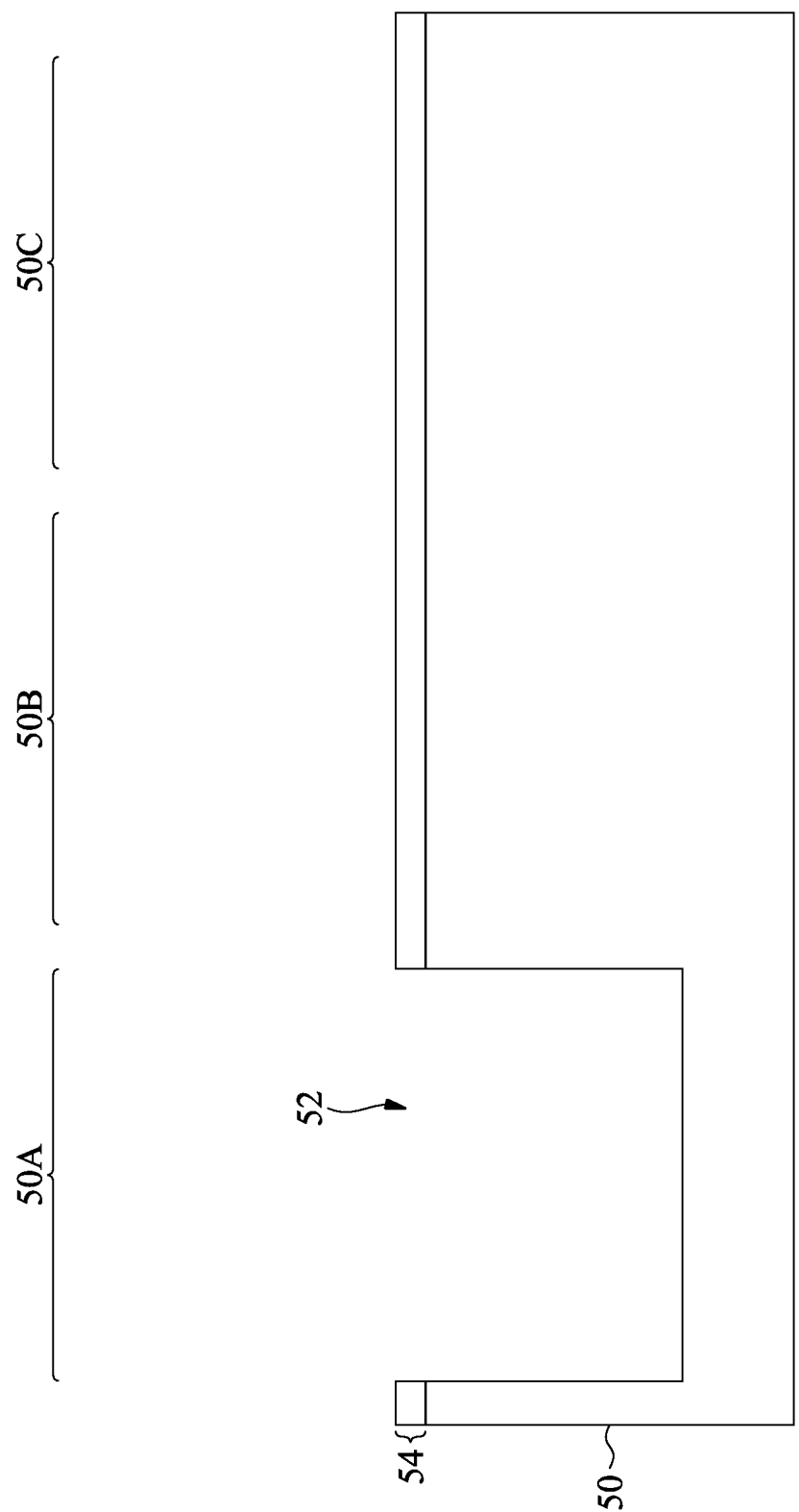

In FIG. 2, recesses 52 are formed in the region 50A of the substrate 50. The recesses 52 may be formed by acceptable photolithography and etching techniques. For example, a mask layer 54 may be formed over the substrate 50. The mask layer 54 may be formed of a non-metallic material, such as silicon nitride, silicon oxide, silicon carbonitride, silicon oxycarbonitride, silicon oxycarbide, or the like, and may be formed by a deposition process such as CVD or the like. The mask layer 54 may also be formed of a metallic material, such as titanium nitride, titanium, tantalum nitride, tantalum, or the like, and may be formed by PVD, Radio Frequency PVD (RFPVD), Atomic Layer Deposition (ALD), or the like. After formation, the mask layer 54 may be patterned with openings corresponding to the recesses 52 in the region 50A. The patterning may be accomplished by forming a photoresist (not shown) over the mask layer 54, exposing and developing the photoresist to have the pattern of the recesses 52, and transferring the pattern of the photoresist to the mask layer 54. The patterned mask layer 54 may then be used as an etching mask to etch the recesses 52 in the region 50A of the substrate 50. The etching may be any acceptable etch process, such as a reactive ion etch (RIE), neutral beam etch (NBE), the like, or a combination thereof. The etch may be anisotropic.

Figure 3:
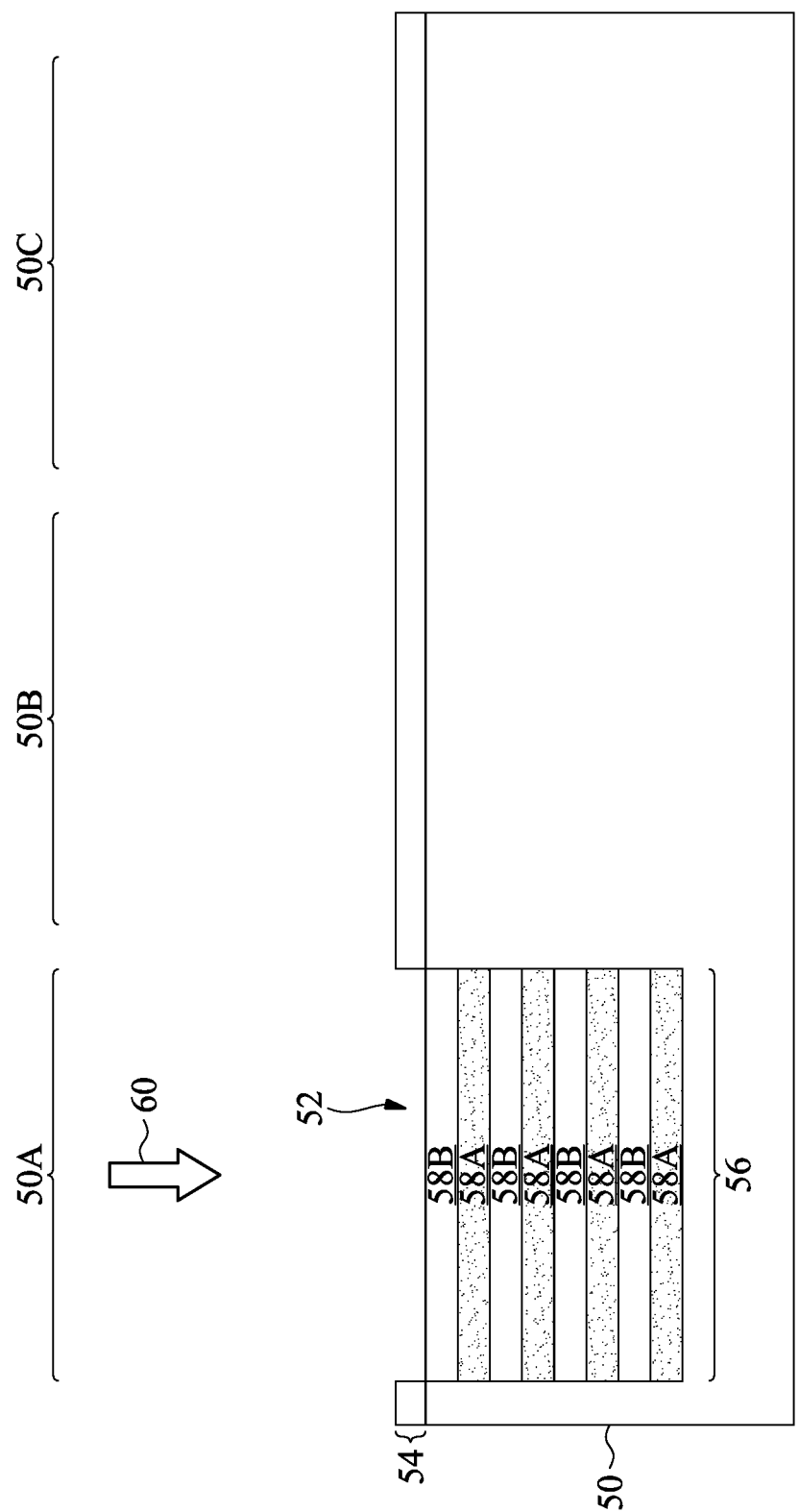

In FIG. 3, epitaxial material stacks 56 are formed in the recesses 52. The epitaxial material stacks 56 include alternating first semiconductor layers 58A and second semiconductor layers 58B. The first semiconductor layers 58A are formed from a first semiconductor material, and the second semiconductor layers 58B are formed from a different second semiconductor material. The first semiconductor material is a material appropriate for forming channel regions of p-type FETs, such as silicon germanium ($Si_xGe_{1-x}$, where x can be in the range of 0 to 1). The second semiconductor material is a material appropriate for forming channel regions of n-type FETs, such as silicon. The epitaxial material stacks 56 may include any quantity of layers. In embodiments where GAA FETs of six possible threshold voltages are formed on the substrate 50, eight total layers (e.g., four of each semiconductor material) may be formed.

The epitaxial material stacks 56 will be patterned to form channel regions of GAA FETs in the region 50A. In particular, the epitaxial material stacks 56 will be patterned to form horizontal nanowires, with the channel regions of the resulting GAA FETs including multiple horizontal nanowires. The GAA FETs formed from the epitaxial material stacks 56 (e.g., in the region 50A of the substrate 50) have a first threshold voltage $V_1$. The first threshold voltage $V_1$ is low. In some embodiments, the first threshold voltage $V_1$ is in the range of from about −0.13 V to about −0.07 V for p-type devices, and is in the range of from about 0.13 V to about 0.07 V for n-type devices.

The epitaxial material stacks 56 may be formed by a first epitaxial growth process 60, which may be performed in a growth chamber. During the first epitaxial growth process 60, the growth chamber is cyclically exposed to a first set of precursors for selectively growing the first semiconductor layers 58A in the recesses 52, and then exposed to a second set of precursors for selectively growing the second semiconductor layers 58B in the recesses 52. The first set of precursors includes precursors for the first semiconductor material (e.g., silicon germanium), and the second set of precursors includes precursors for the second semiconductor material (e.g., silicon). The epitaxial material stacks 56 are undoped. As such, the precursors for the first epitaxial growth process 60 do not include precursors for impurities. In some embodiments, the first set of precursors includes a silicon precursor (e.g., silane) and a germanium precursor (e.g., a germane), and the second set of precursors includes the silicon precursor but omits the germanium precursor. The first epitaxial growth process 60 may thus include continuously enabling a flow of the silicon precursor to the growth chamber, and then cyclically: (1) enabling a flow of the germanium precursor to the growth chamber when growing a first semiconductor layer 58A; and (2) disabling the flow of the germanium precursor to the growth chamber when growing a second semiconductor layer 58B. The cyclical exposure may be repeated until a desired quantity of layers are formed.

Figure 4:
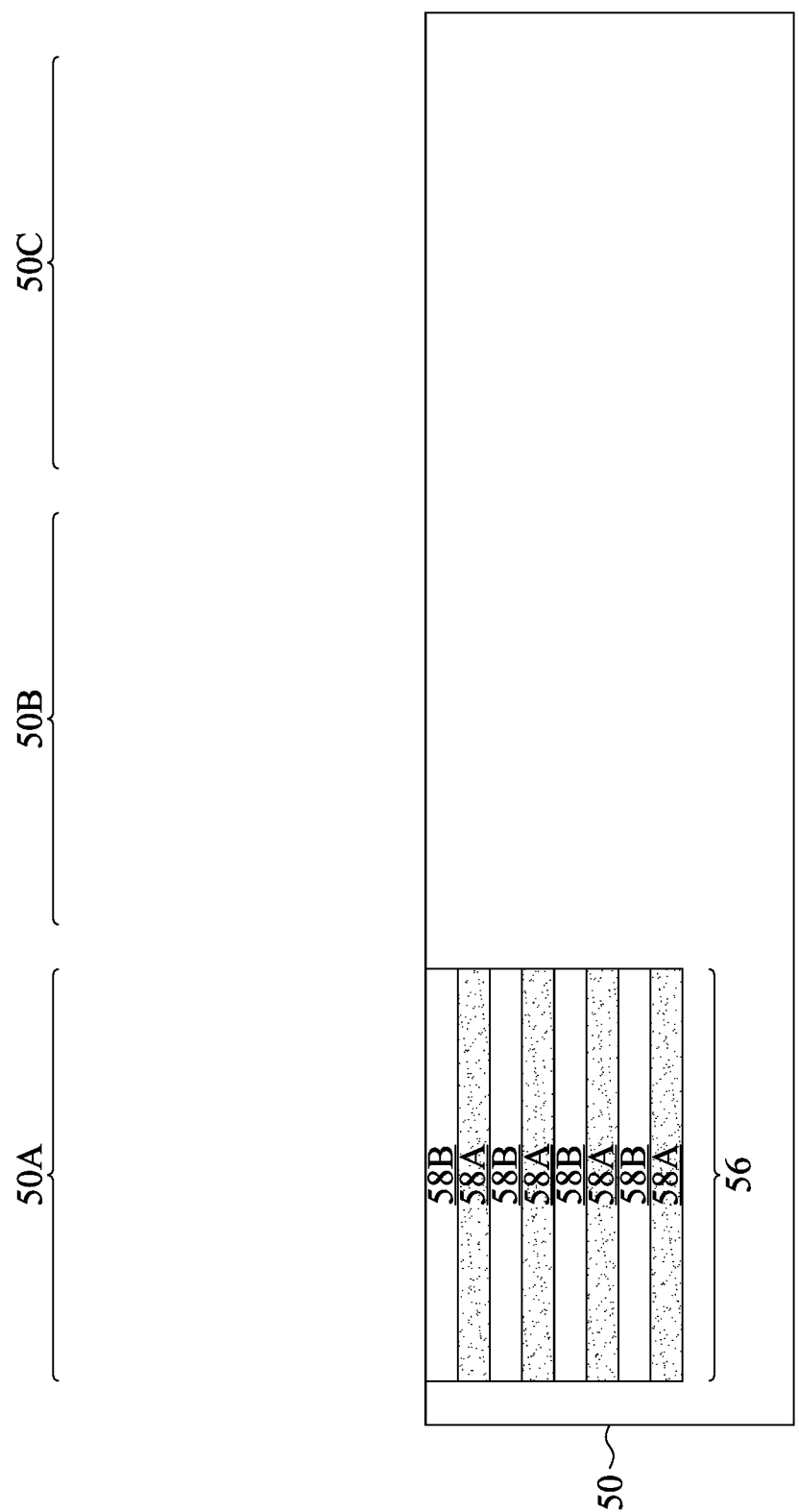

In FIG. 4, a planarization process is performed to level the top surface of the substrate 50 with top surfaces of the epitaxial material stacks 56. The planarization process also removes the mask layer 54 and portions of the epitaxial material stacks 56 extending out of the recesses 52. The planarization process may be a chemical mechanical polish (CMP), an etch back process, combinations thereof, or the like. After the planarization process, top surfaces of the substrate 50 and epitaxial material stacks 56 are level.

Figure 5:
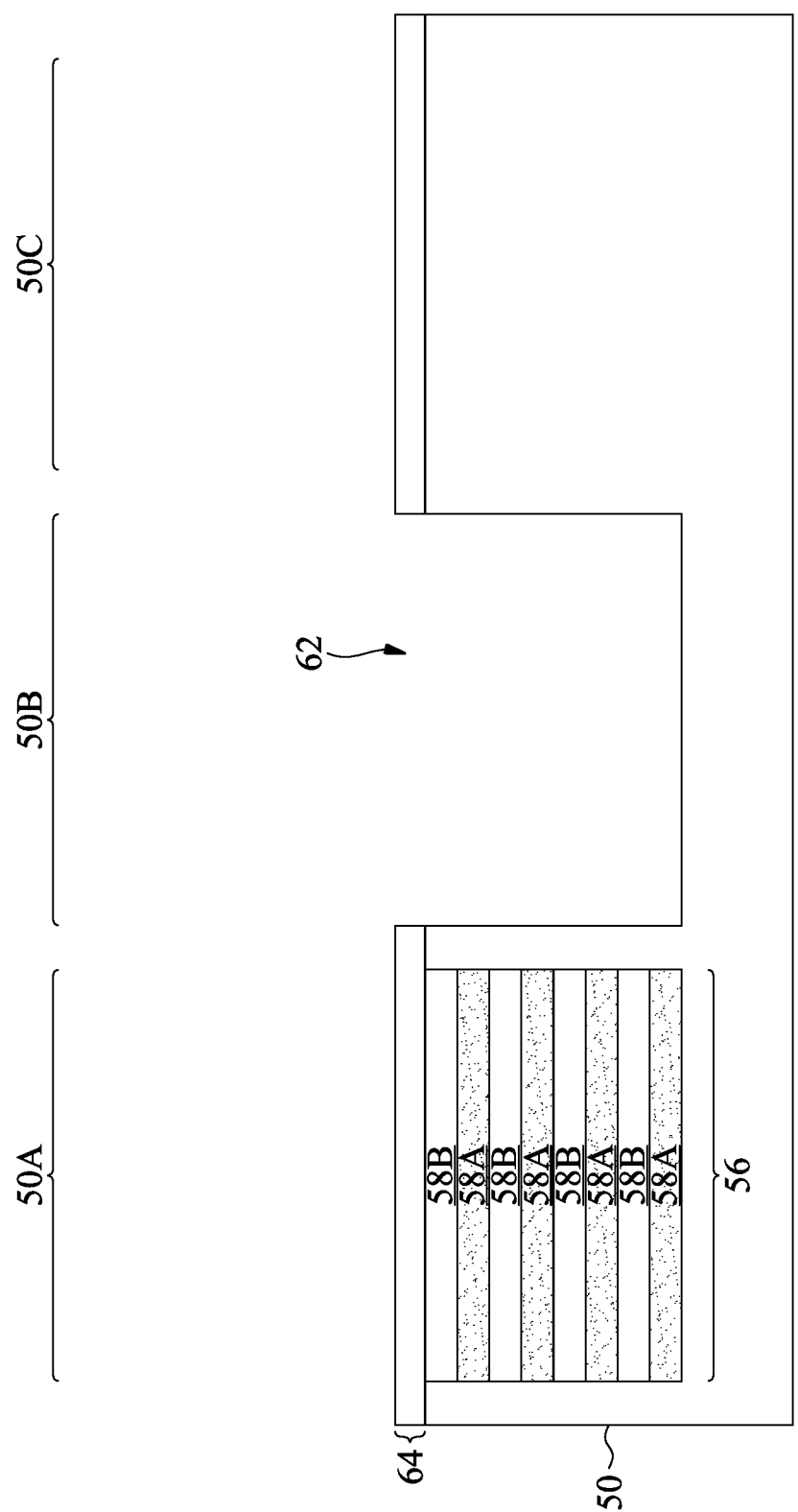

In FIG. 5, recesses 62 are formed in the region 50B of the substrate 50. The recesses 62 may be formed by a similar method as the method for forming the recesses 52, e.g., using a patterned mask layer 64 as an etching mask during an acceptable etch process. Alternatively, the recesses 62 may be formed by a different method.

Figure 6:
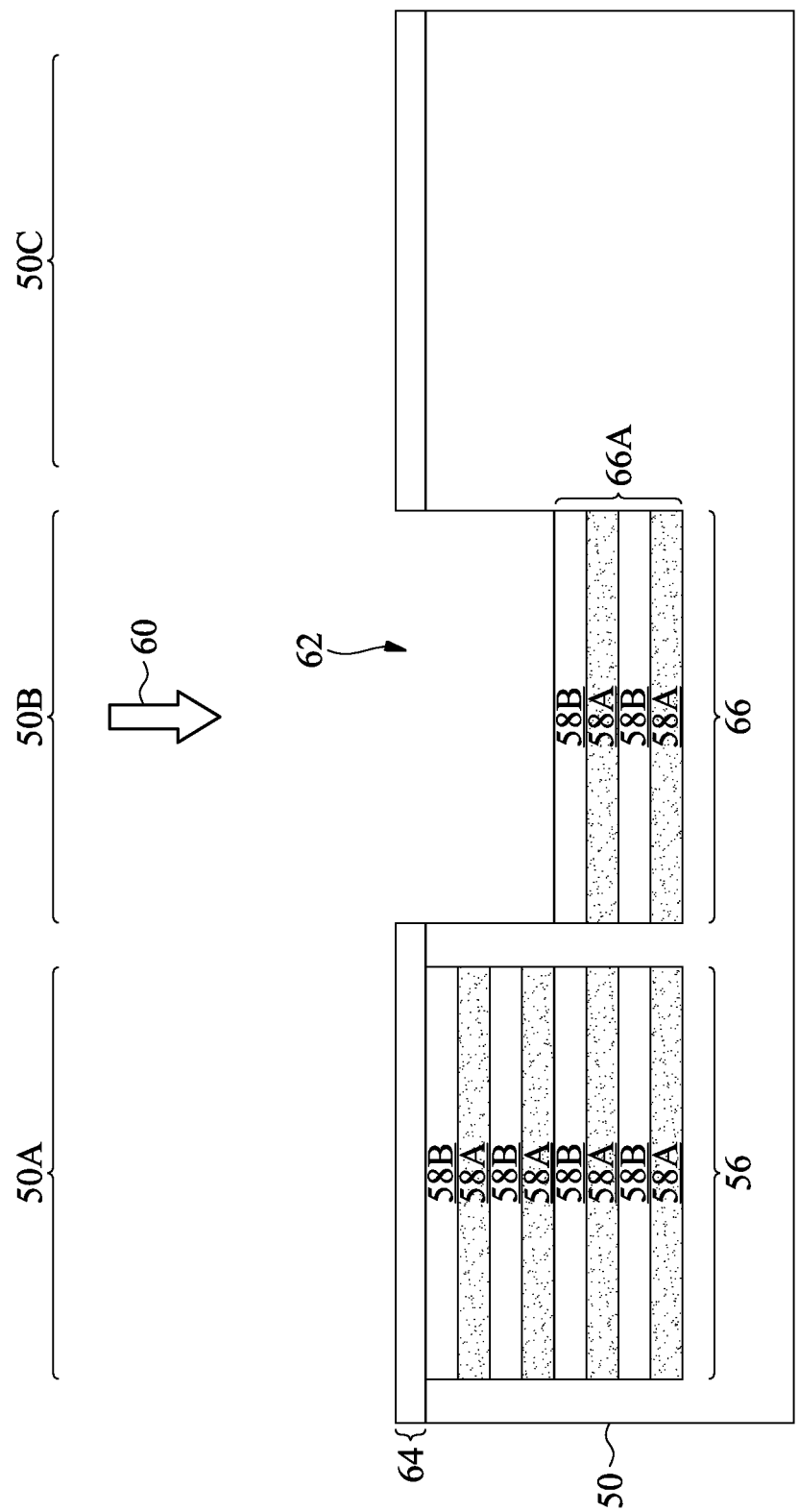
Figure 7:
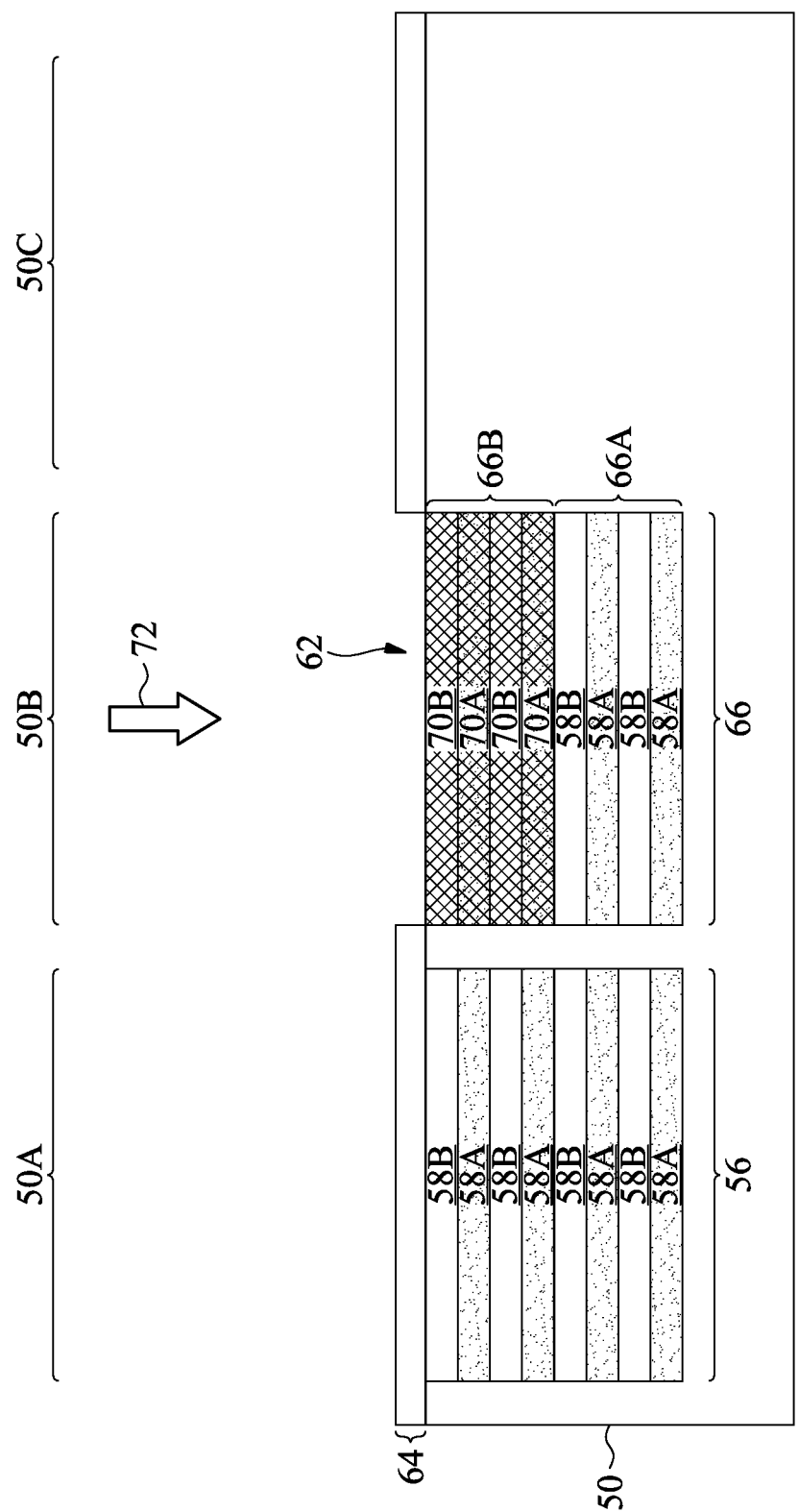

In FIGS. 6 and 7, epitaxial material stacks 66 are formed in the recesses 62. The epitaxial material stacks 66 include alternating semiconductor layers. A first subset 66A of the layers are undoped semiconductor layers. A second subset 66B of the layers are doped semiconductor layers. The epitaxial material stacks 66 have the same quantity of layers as the epitaxial material stacks 56.

The epitaxial material stacks 66 will also be patterned to form channel regions of GAA FETs in the region 50B. The GAA FETs formed from the epitaxial material stacks 66 (e.g., in the region 50B of the substrate 50) have a second threshold voltage $V_2$. The threshold voltage of a GAA FET is affected by the concentration of impurities in the channel region of the GAA FET, where a higher concentrations of impurities results in a higher threshold voltage. The concentrations of impurities in a channel region of a FET refers to an average impurity concentration for the nanowires forming the channel region of the FET. Because the epitaxial material stacks 66 include doped layers, the second threshold voltage $V_2$ is greater than the first threshold voltage $V_1$. In some embodiments, the second threshold voltage $V_2$ is in the range of from about −0.23 V to about −0.17 V for p-type devices, and is in the range of from about 0.23 V to about 0.17 V for n-type devices.

The first subset 66A of the layers (see FIG. 6) includes alternating ones of the first semiconductor layers 58A and second semiconductor layers 58B. The first subset 66A of the layers are formed by performing some cycles of the first epitaxial growth process 60. In embodiments where GAA FETs of six possible threshold voltages are desired, the first subset 66A of the epitaxial material stacks 66 includes half of the total layers of the stacks.

The second subset 66B of the layers (see FIG. 7) includes alternating first semiconductor layers 70A and second semiconductor layers 70B. The first semiconductor layers 70A are formed from the same base semiconductor materials as the first semiconductor layers 58A (e.g., silicon germanium), and are additionally doped with Group V elements (e.g., phosphorous, arsenic, etc.). The second semiconductor layers 70B are formed from the same base semiconductor materials as the second semiconductor layers 58B (e.g., silicon), and are additionally doped with Group III elements (e.g., boron). The second subset 66B of the layers may be formed by a second epitaxial growth process 72, which may be performed in the same growth chamber as the first epitaxial growth process 60. During the second epitaxial growth process 72, the growth chamber is cyclically exposed to the same sets of precursors as the first epitaxial growth process 60, and is additionally exposed to appropriate impurity precursors. For example, during the second epitaxial growth process 72, the first set of precursors may further include a precursor for the Group V impurity, and the second set of precursors may further include a precursor for the Group III impurity. The second epitaxial growth process 72 may thus include continuously enabling a flow of the silicon precursor to the growth chamber, and then cyclically: (1) enabling flows of the germanium and Group V precursors to the growth chamber when growing the first semiconductor layers 70A; and (2) disabling the flow of the germanium precursor and enabling the flow of the Group III precursor to the growth chamber when growing the second semiconductor layers 70B. The cyclical exposure may be repeated until a desired quantity of layers are formed. Continuing the above example, the second subset 66B of the epitaxial material stacks 66 may include half of the total layers of the stacks.

The first semiconductor layers 70A and second semiconductor layers 70B may be doped to any impurity concentration. As discussed above, greater impurity concentrations increase the threshold voltages of the resulting GAA FETs in the region 50B. The first semiconductor layers 70A and second semiconductor layers 70B may be doped to the same concentration, or may be doped to different concentrations. In some embodiments, the first semiconductor layers 70A are doped with arsenic to a concentration in the range of from about $10^{17}$ cm$^{-3}$ and about $10^{19}$ cm$^{-3}$ (such as about $10^{19}$ cm$^{-3}$), and the second semiconductor layers 70B are doped with boron to a concentration in the range of from about $10^{17}$ cm$^{-3}$ and about $10^{19}$ cm$^{-3}$ (such as about $10^{19}$ cm$^{-3}$).

Figure 8:
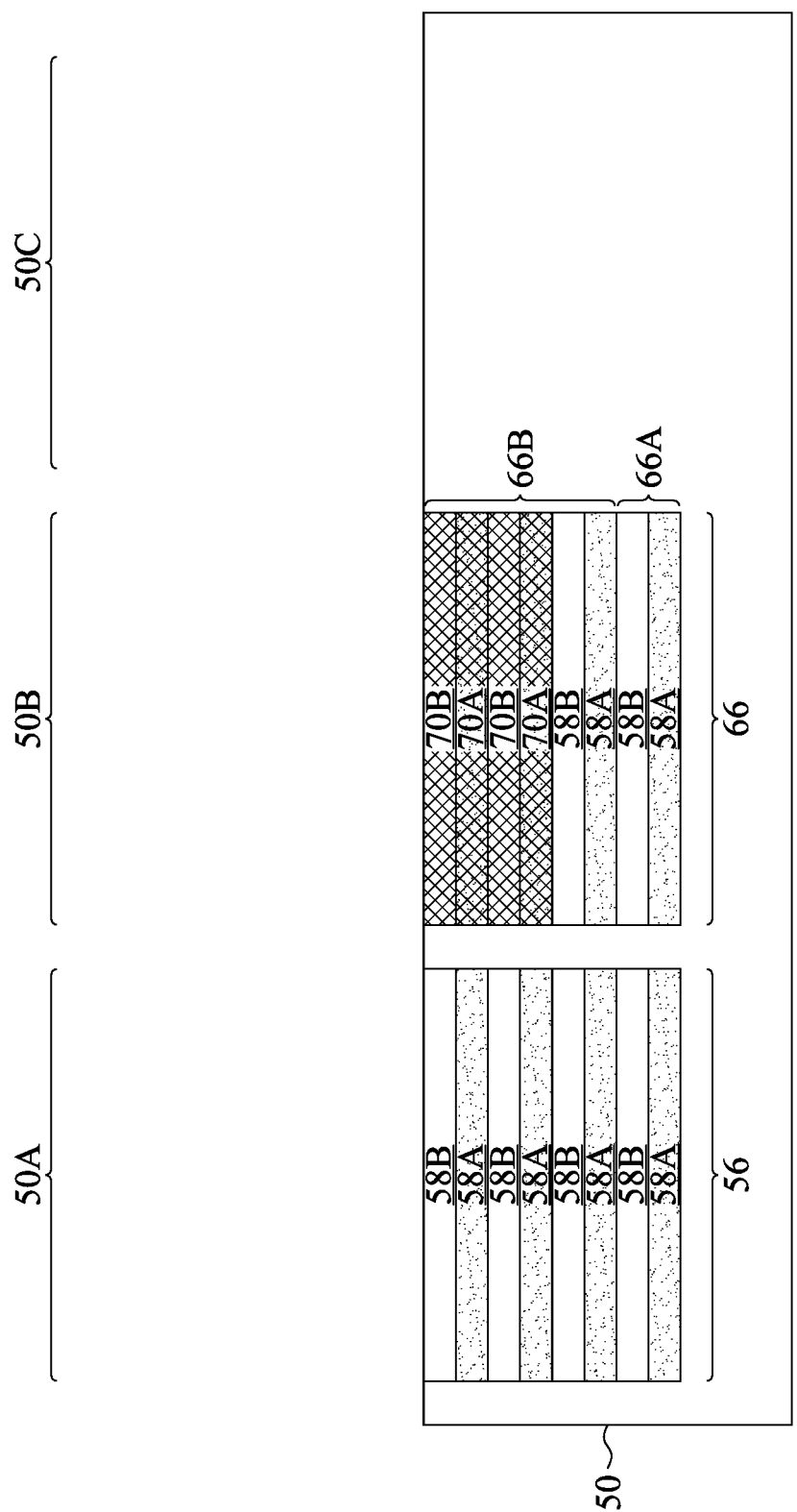

In FIG. 8, a planarization process is performed to level the top surface of the substrate 50 with top surfaces of the epitaxial material stacks 66. The planarization process also removes the mask layer 64 and portions of the epitaxial material stacks 66 extending out of the recesses 62. The planarization process may be a chemical mechanical polish (CMP), an etch back process, combinations thereof, or the like. After the planarization process, top surfaces of the substrate 50 and epitaxial material stacks 56 and 66 are level.

Figure 9:
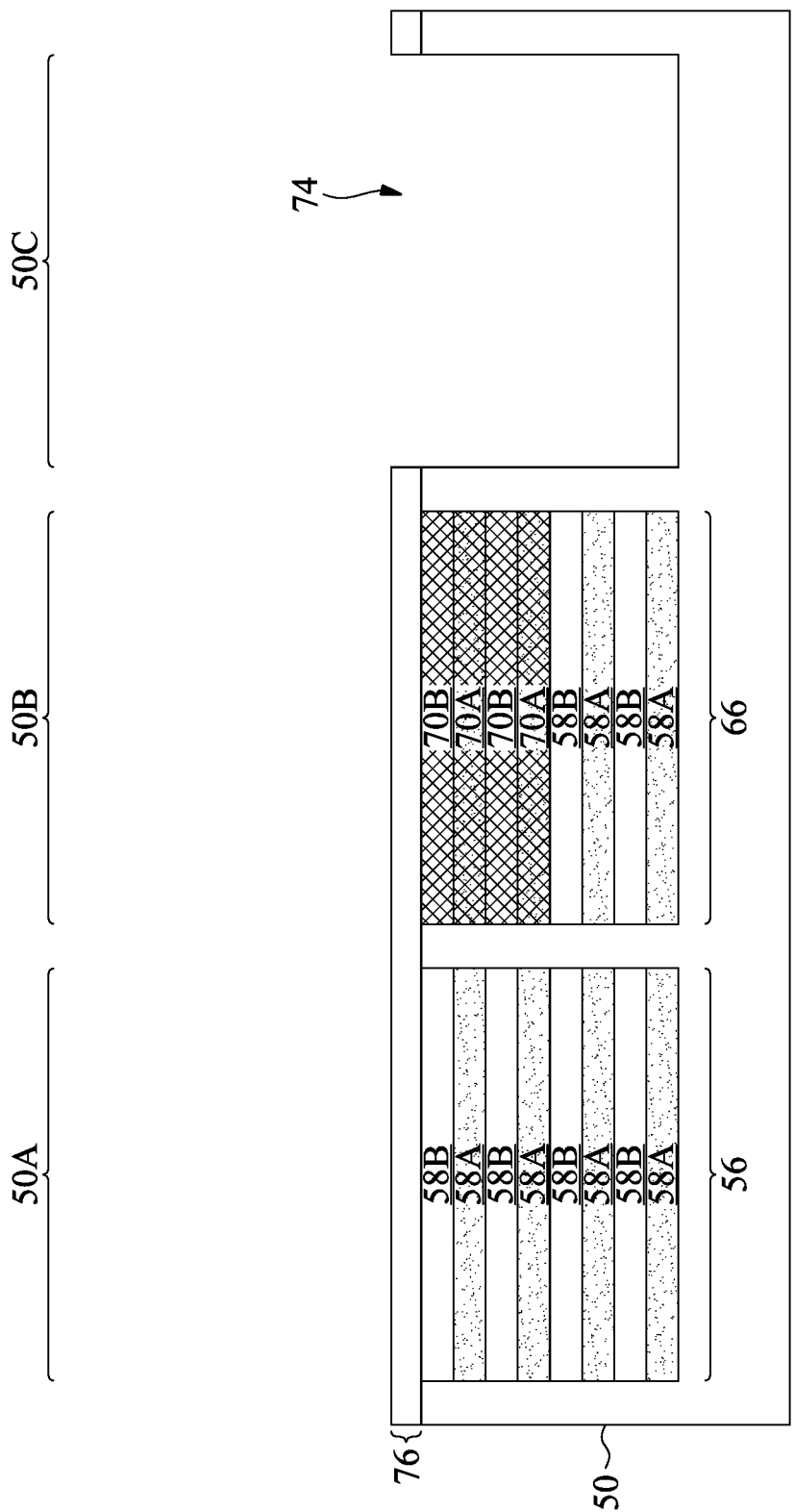

In FIG. 9, recesses 74 are formed in the region 50C of the substrate 50. The recesses 74 may be formed by a similar method as the method for forming the recesses 52, e.g., using a patterned mask layer 76 as an etching mask during an acceptable etch process. Alternatively, the recesses 74 may be formed by a different method.

Figure 10:
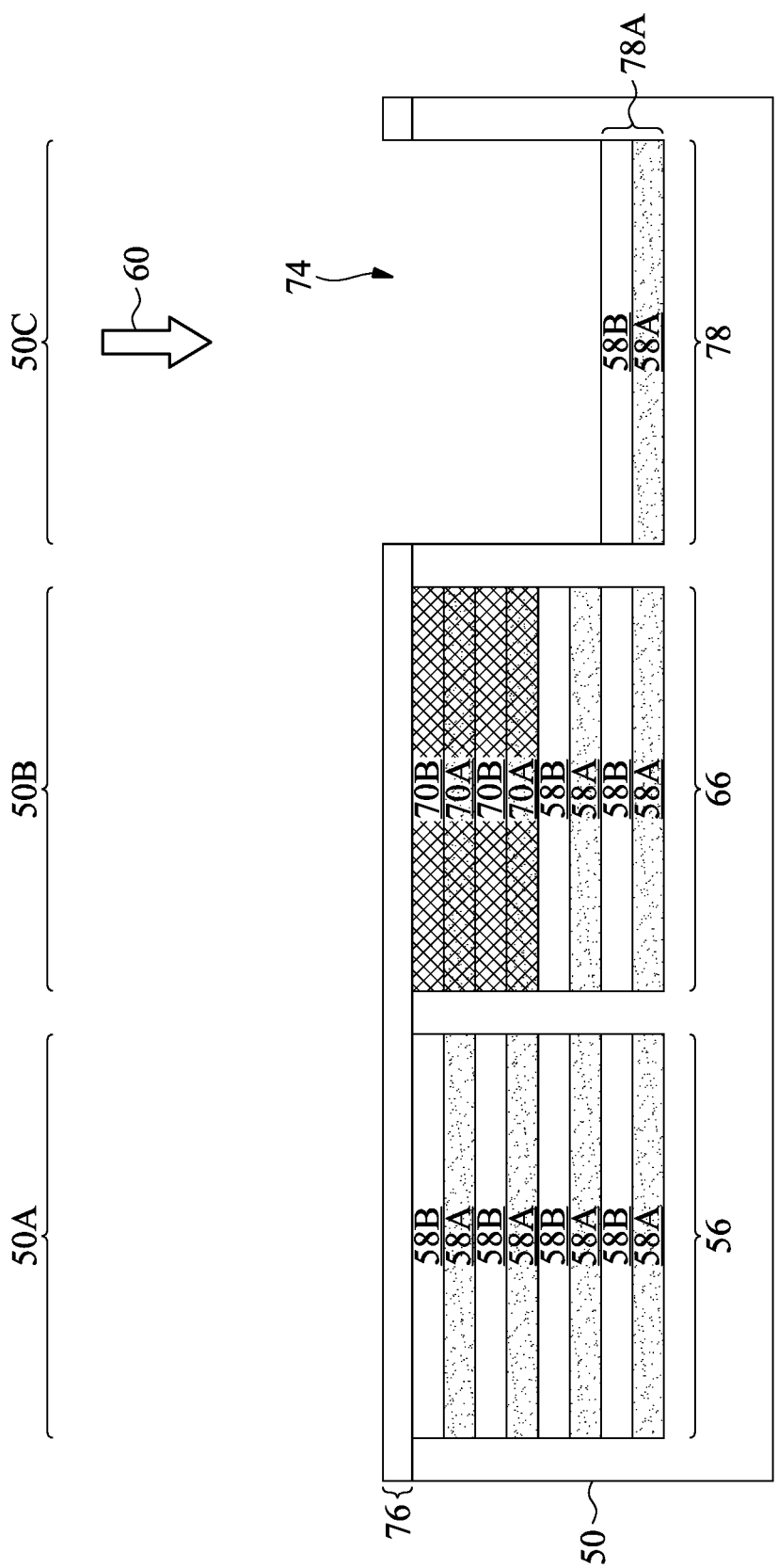
Figure 11:
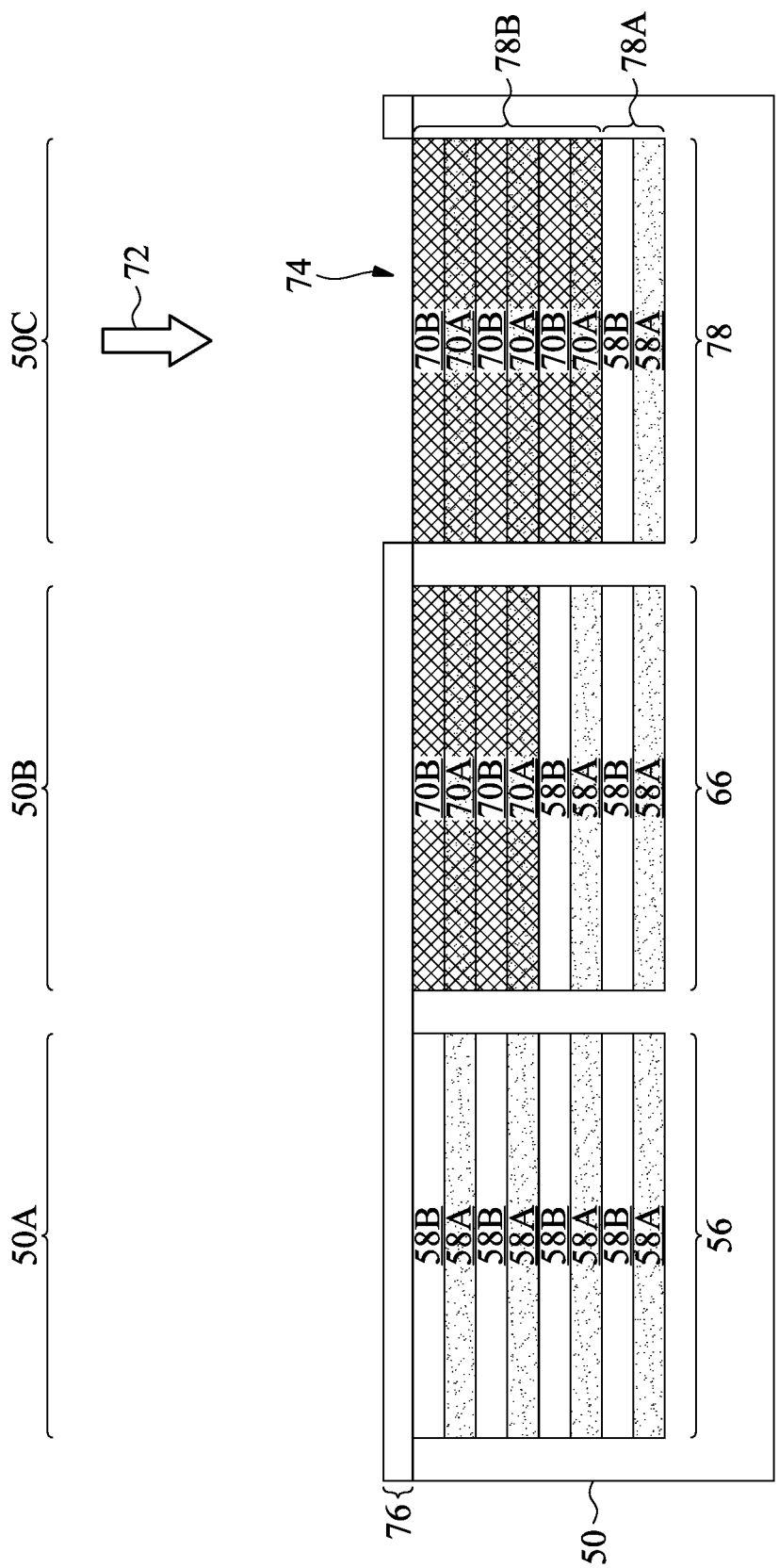

In FIGS. 10 and 11, epitaxial material stacks 78 are formed in the recesses 74. The epitaxial material stacks 78 include alternating semiconductor layers. A first subset 78A of the layers are undoped semiconductor layers. A second subset 78B of the layers are doped semiconductor layers. The epitaxial material stacks 78 have the same quantity of layers as the epitaxial material stacks 56 and 66.

The epitaxial material stacks 78 will also be patterned to form channel regions of GAA FETs in the region 50C. The GAA FETs formed from the epitaxial material stacks 78 (e.g., in the region 50C of the substrate 50) have a third threshold voltage $V_3$. As discussed above, the threshold voltage of a GAA FET is affected by the concentration of impurities in the channel region of the GAA FET, and the concentrations of impurities in a channel region refers to an average impurity concentration for the nanowires forming the channel region. In the embodiment shown, like layers of the epitaxial material stacks 66 and 78 have a same impurity concentration, and the quantity of doped semiconductor layers in the epitaxial material stacks 78 is greater than the quantity of doped semiconductor layers in the epitaxial material stacks 66. In other embodiments (not shown), the layers of the epitaxial material stacks 66 and 78 have different impurity concentrations, and the quantity of doped semiconductor layers in the epitaxial material stacks 78 is the same as the quantity of doped semiconductor layers in the epitaxial material stacks 66. The average impurity concentration in the epitaxial material stacks 78 is thus greater than the epitaxial material stacks 66. Because the epitaxial material stacks 78 include more doped layers than the epitaxial material stacks 66, the third threshold voltage $V_3$ is greater than the second threshold voltage $V_2$ and the first threshold voltage $V_1$. In some embodiments, the third threshold voltage $V_3$ is in the range of from about −0.33 V to about −0.27 V for p-type devices, and is in the range of from about 0.33 V to about 0.27 V for n-type devices.

The first subset 78A of the layers (see FIG. 10) include alternating ones of the first semiconductor layers 58A and second semiconductor layers 58B. The first subset 78A of the layers are formed by performing some cycles of the first epitaxial growth process 60. In embodiments where GAA FETs of six possible threshold voltages are desired, the first subset 78A of the epitaxial material stacks 78 includes one quarter of the total layers of the stacks.

The second subset 78B of the layers (see FIG. 11) include alternating ones of the first semiconductor layers 70A and second semiconductor layers 70B. The second subset 78B of the layers are formed by performing some cycles of the second epitaxial growth process 72. In embodiments where GAA FETs of six possible threshold voltages are desired, the second subset 78B of the epitaxial material stacks 78 includes three quarters of the total layers of the stacks.

Figure 12:
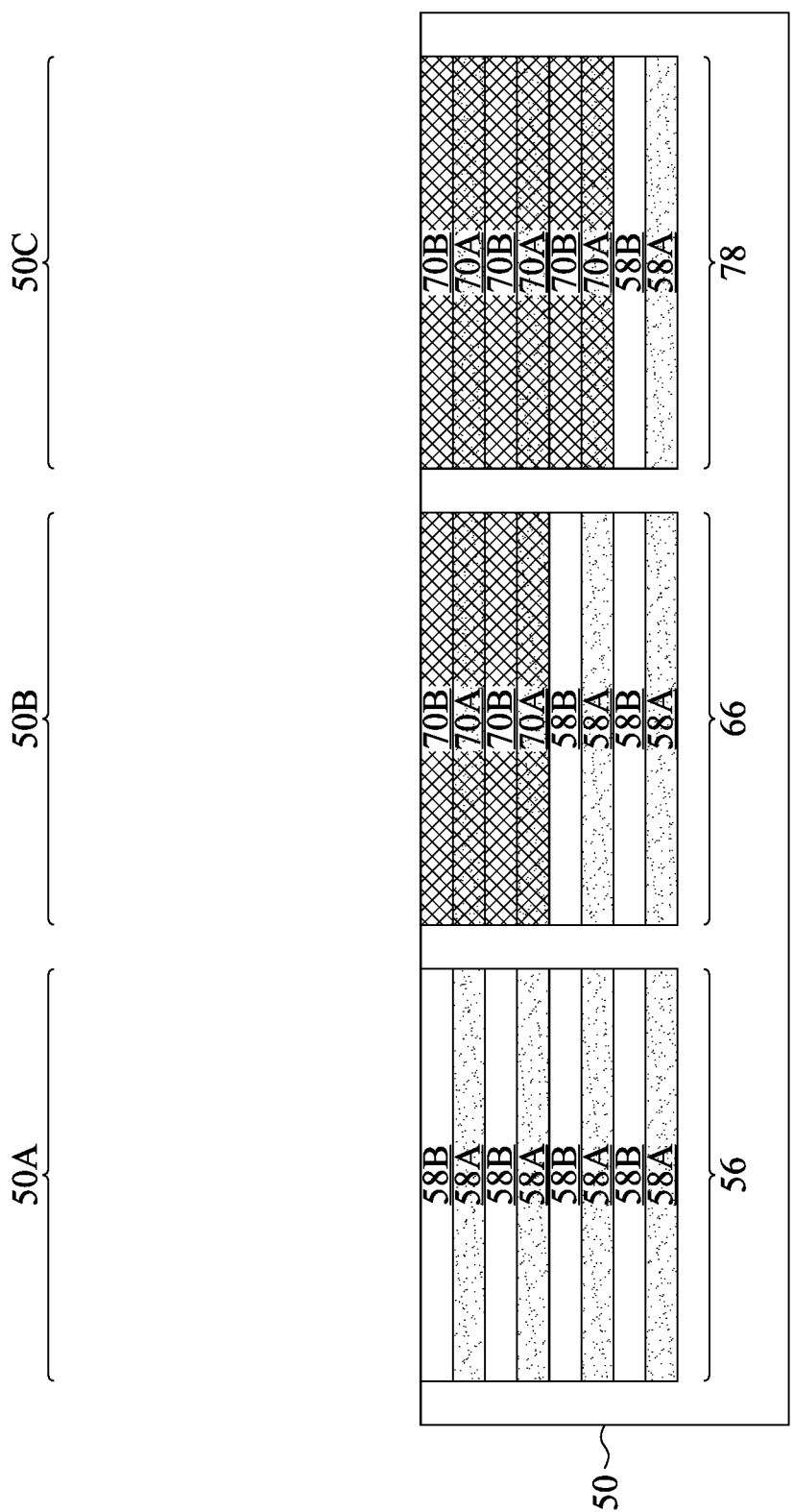

In FIG. 12, a planarization process is performed to level the top surface of the substrate 50 with top surfaces of the epitaxial material stacks 78. The planarization process also removes the mask layer 76 and portions of the epitaxial material stacks 78 extending out of the recesses 74. The planarization process may be a chemical mechanical polish (CMP), an etch back process, combinations thereof, or the like. After the planarization process, top surfaces of the substrate 50 and epitaxial material stacks 56, 66, and 78 are level.

FIGS. 13 through 20 and 22 are perspective views of further intermediate stages in the manufacturing of GAA FETs, in accordance with some embodiments. FIGS. 21A and 21B are cross-sectional views shown along a reference cross-section A/B-A/B in FIG. 20. FIGS. 23A and 23B are cross-sectional views shown along a reference cross-section A/B-A/B in FIG. 22. Only one of the regions 50A/50B/50C of the substrate 50 is illustrated. It should be appreciated that similar processing may be performed in all of the regions 50A/50B/50C of the substrate 50. Further, although only a single gate structure and pair of source/drain regions are illustrated, it should be appreciated that multiple gate structures and many source/drain regions may be formed.

Figure 13:
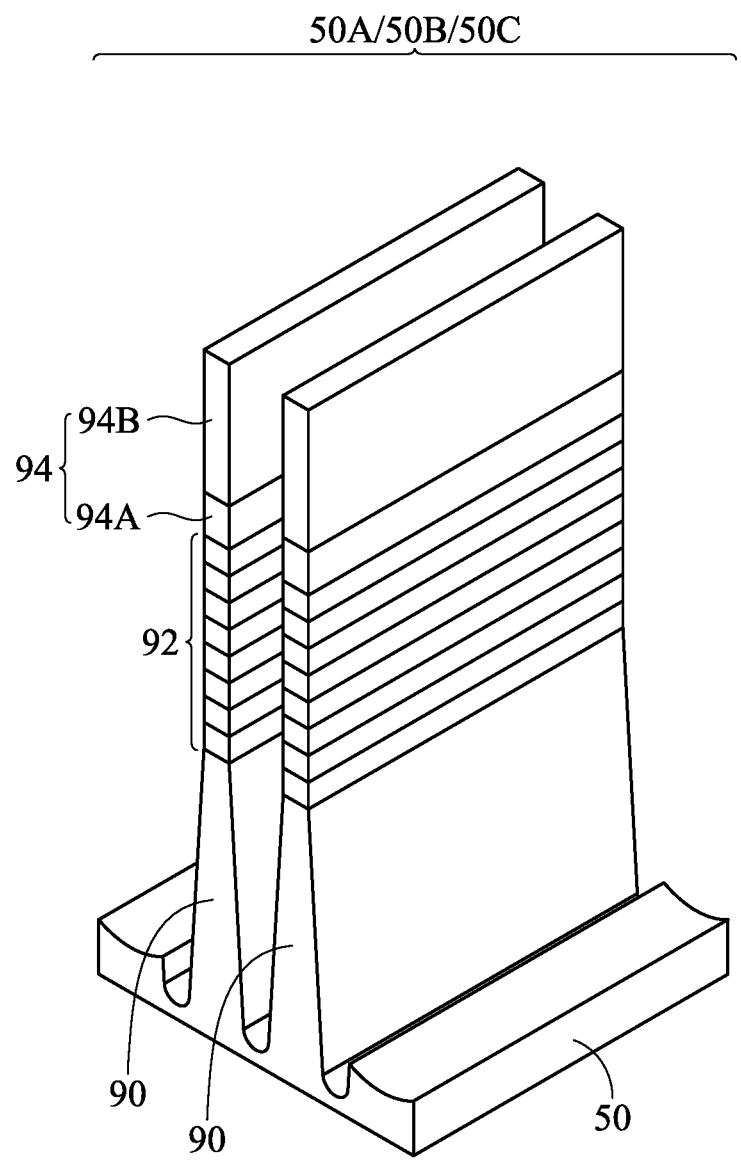

In FIG. 13, fins 90 and GAA structures 92 are formed in the substrate 50. The fins 90 are semiconductor strips, and the GAA structures 92 are disposed on the fins 90. In some embodiments, the fins 90 and GAA structures 92 may be formed by etching trenches, respectively, in the substrate 50 and the epitaxial material stacks 56, 66, and 78.

The GAA structures 92 may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structures 92.

In some embodiments, the remaining spacers are used to pattern a mask 94, which is then used to pattern the GAA structures 92 and fins 90. The mask 94 may be a single layer mask, or may be a multilayer mask such as a multilayer mask that includes a first mask layer 94A and a second mask layer 94B. The first mask layer 94A and second mask layer 94B may each be formed from a dielectric material such as silicon oxide, silicon nitride, a combination thereof, or the like, and may be deposited or thermally grown according to acceptable techniques. The first mask layer 94A and second mask layer 94B are different materials having a high etch selectivity. For example, the first mask layer 94A may be silicon oxide, and the second mask layer 94B may be silicon nitride. The mask 94 may be patterned by any acceptable etch process. The mask 94 may then be used as an etching mask to etch the substrate 50 and the epitaxial material stacks 56, 66, and 78. The etching may be any acceptable etch process, such as a reactive ion etch (RIE), neutral beam etch (NBE), the like, or a combination thereof. The etch may be anisotropic.

Figure 14:
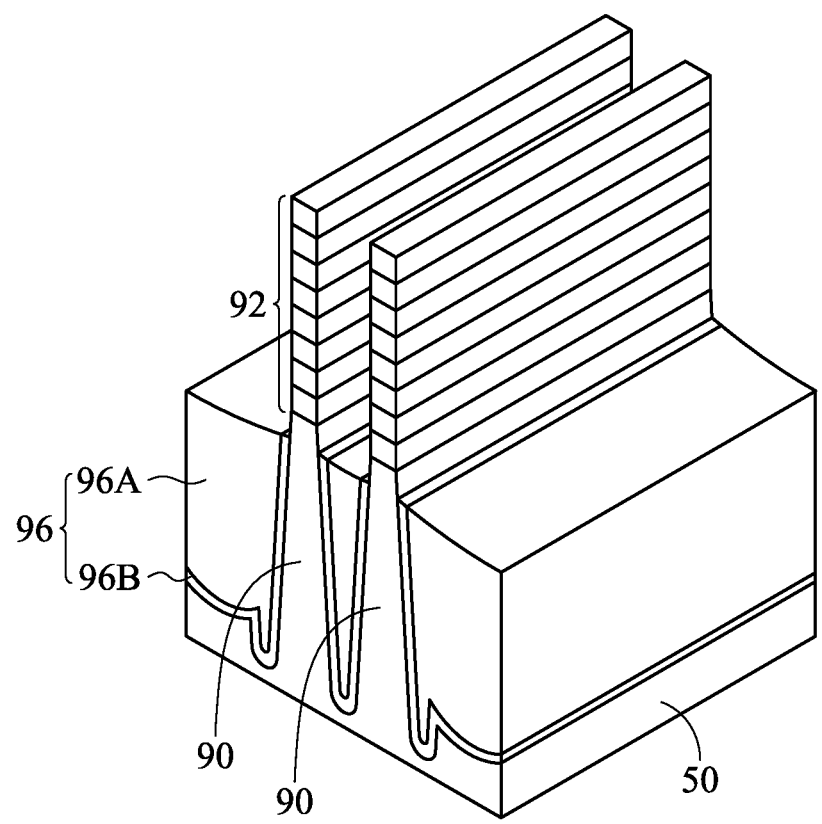

In FIG. 14, Shallow Trench Isolation (STI) regions 96 are formed over the substrate 50 and between neighboring fins 90. As an example to form the STI regions 96, an insulation material may be formed over the substrate 50. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. An anneal process may be performed once the insulation material is formed. In an embodiment, the insulation material is formed such that excess insulation material covers the fins 90 and GAA structures 92. In some embodiments, a liner 96B is first formed along surfaces of the substrate 50 and fins 90, and a fill material 96A, such as those discussed above is formed over the liner 96B. In some embodiments, the liner 96A is omitted. Next, a removal process is applied to the insulation material to remove excess insulation material over the fins 90 and GAA structures 92. In some embodiments, a planarization process such as a chemical mechanical polish (CMP), an etch back process, combinations thereof, or the like may be utilized. The planarization process exposes the GAA structures 92 such that top surfaces of the GAA structures 92 and the insulation material are level after the planarization process is complete. Next, the insulation material is recessed to form the STI regions 96. The insulation material is recessed such that the GAA structures 92 protrude from between neighboring STI regions 96. Further, the top surfaces of the STI regions 96 may have a flat surface as illustrated, a convex surface, a concave surface (such as dishing), or a combination thereof. The top surfaces of the STI regions 96 may be formed flat, convex, and/or concave by an appropriate etch. The STI regions 96 may be recessed using an acceptable etching process, such as one that is selective to the material of the insulation material (e.g., etches the material of the insulation material at a faster rate than the material of the fins 90 and GAA structures 92). For example, a chemical oxide removal with a suitable etch process using, for example, dilute hydrofluoric (dHF) acid may be used.

Figure 15:
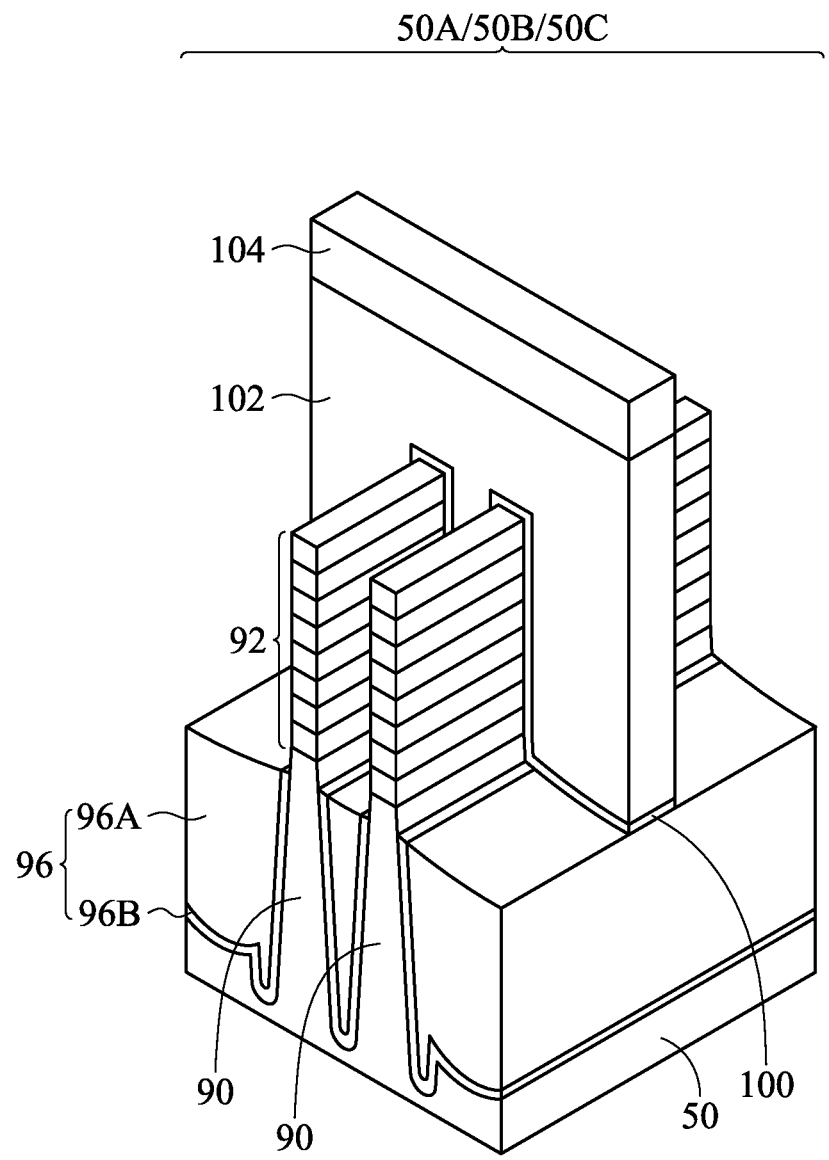

In FIG. 15, dummy dielectrics 100 are formed on the GAA structures 92, and dummy gates 102 are formed on the dummy dielectrics 100. As an example to form the dummy dielectrics 100 and dummy gates 102, a dummy dielectric layer may be formed on the GAA structures 92 and STI regions 96. The dummy dielectric layer may be, for example, silicon oxide, silicon nitride, a combination thereof, or the like, and may be deposited or thermally grown according to acceptable techniques. A dummy gate layer may then be formed over the dummy dielectric layer. The dummy gate layer may be deposited over the dummy dielectric layer and then planarized, such as by a CMP. The dummy gate layer may be a conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer may be deposited by physical vapor deposition (PVD), CVD, sputter deposition, or other techniques known and used in the art for depositing conductive materials. The dummy gate layer may be made of other materials that have a high etching selectivity from the etching of isolation regions. Masks 104 are then formed over the dummy gate layer. The masks 104 may be formed from silicon nitride, silicon oxynitride, combinations thereof, or the like, and may be patterned using acceptable photolithography and etching techniques. The pattern of the masks 104 then may be transferred to the dummy gate layer by an acceptable etching technique to form the dummy gates 102, and then transferred to the dummy dielectric layer by acceptable etching technique to form the dummy dielectrics 100. The dummy gates 102 cover respective channel regions of the GAA structures 92. The pattern of the masks 104 may be used to physically separate each of the dummy gates 102 from adjacent dummy gates. The dummy gates 102 may also have a lengthwise direction substantially perpendicular to the lengthwise direction of the fins 90.

Figure 16:
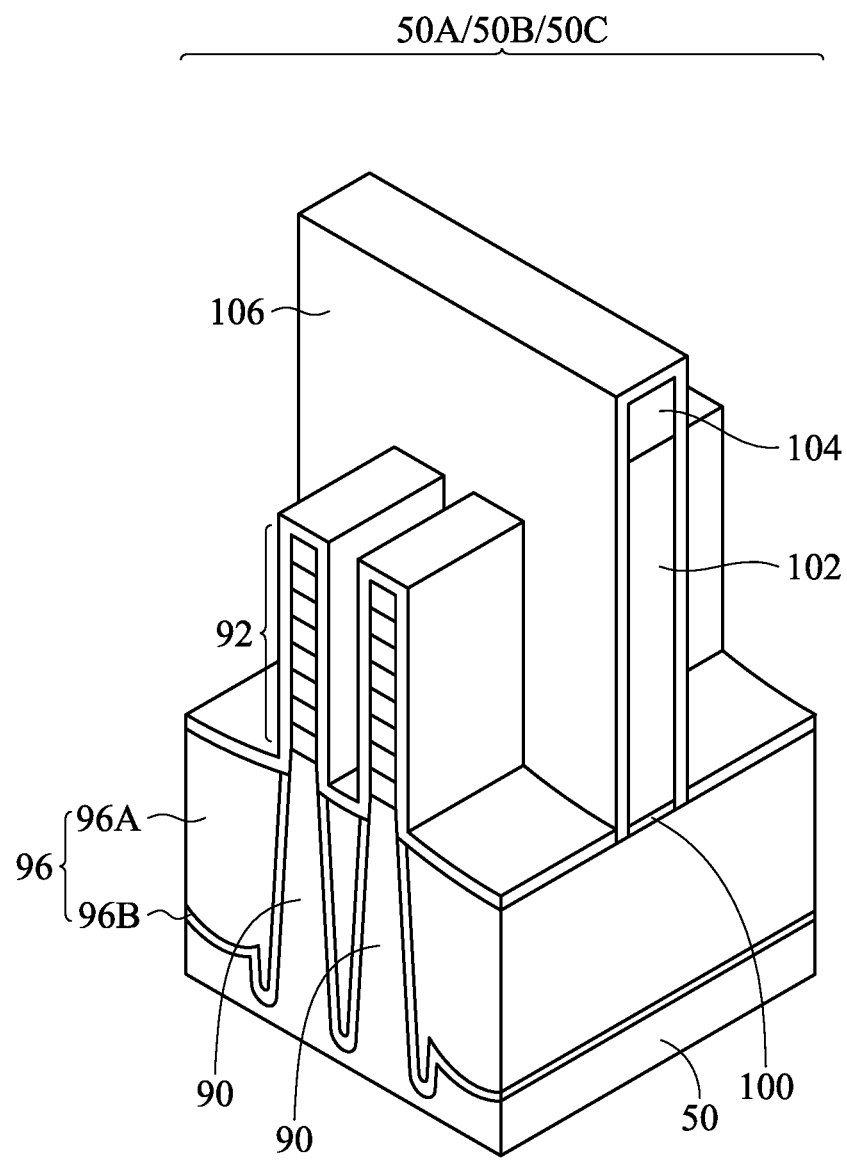

In FIG. 16, a gate spacer layer 106 is formed by conformally depositing an insulating material over the GAA structures 92, STI regions 96, and dummy gates 102. The insulating material may be silicon nitride, silicon carbonitride, a combination thereof, or the like. In some embodiments, the gate spacer layer 106 includes multiple sublayers. For example, a first sublayer (sometimes referred to as a gate seal spacer layer) may be formed by thermal oxidation or a deposition, and a second sublayer (sometimes referred to as a main gate spacer layer) may be conformally deposited on the first sublayer.

After the formation of the gate spacer layer 106, implants for lightly doped source/drain (LDD) regions (not shown) may be performed. Appropriate type (e.g., p-type or n-type) impurities may be implanted into the exposed GAA structures 92 and/or fins 90. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

Figure 17:
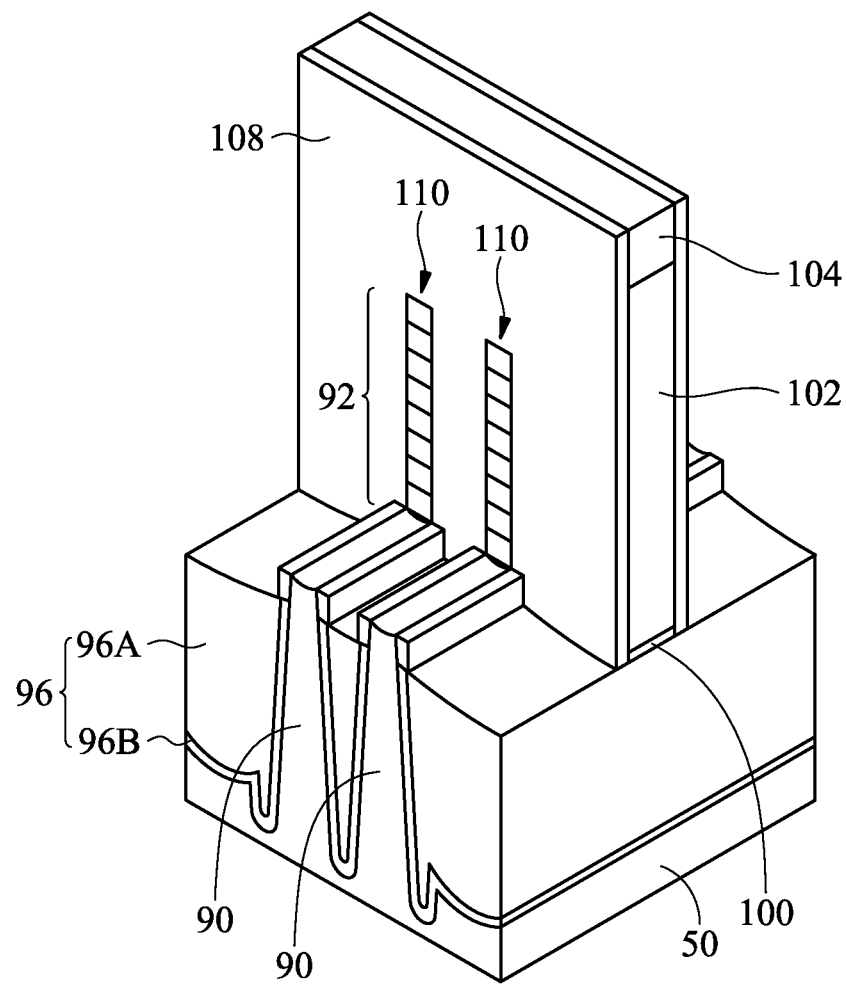

In FIG. 17, gate spacers 108 are formed by anisotropically etching the gate spacer layer 106. The anisotropic etching may remove horizontal portions of the gate spacer layer 106 (e.g., over the STI regions 96 and dummy gates 102), with remaining vertical portions of the gate spacer layer 106 (e.g., along sides of the dummy gates 102 and GAA structures 92) forming the gate spacers 108.

Further, source/drain recesses 110 are formed in the GAA structures 92. The source/drain recesses 110 may extend through the GAA structures 92 and into the fins 90. The source/drain recesses 110 may be formed by acceptable etching techniques, using the dummy gates 102 as an etching mask.

Figure 18:
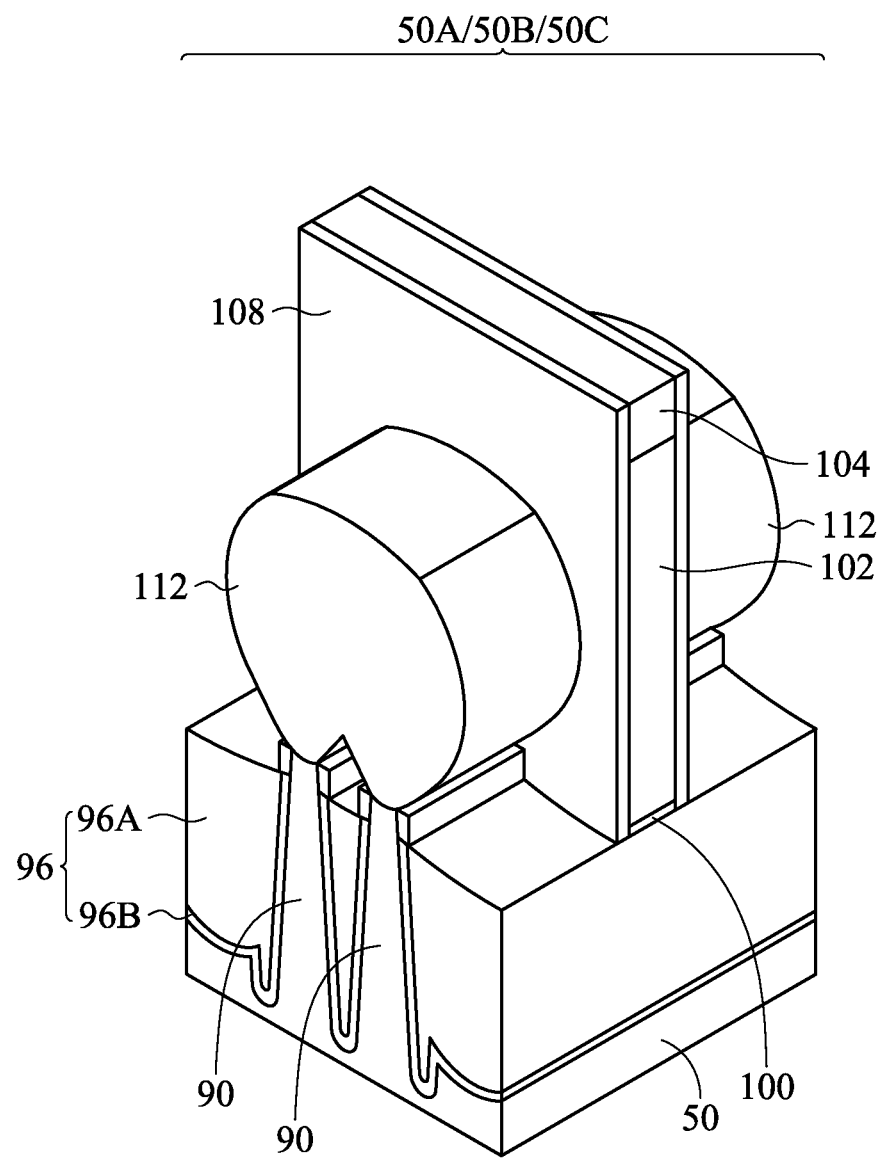

In FIG. 18, epitaxial source/drain regions 112 are formed in the source/drain recesses 110 to exert stress in the respective channel regions of the GAA structures 92, thereby improving performance. The epitaxial source/drain regions 112 are formed in the GAA structures 92 such that each dummy gate 102 is disposed between respective neighboring pairs of the epitaxial source/drain regions 112. In some embodiments the epitaxial source/drain regions 112 may extend into, and may also penetrate through, the fins 90. In some embodiments, the gate spacers 108 are used to separate the epitaxial source/drain regions 112 from the dummy gates 102 by an appropriate lateral distance so that the epitaxial source/drain regions 112 do not short out subsequently formed gates of the resulting GAA FETs.

The epitaxial source/drain regions 112 are epitaxially grown in the source/drain recesses 110. The epitaxial source/drain regions 112 may include any acceptable material, such as appropriate for n-type or p-type GAA FETs. For example, when n-type GAA FETs are formed, the epitaxial source/drain regions 112 may include materials exerting a tensile strain in the channel regions, such as silicon, SiC, SiCP, SiP, or the like. Likewise, when p-type GAA FETs are formed, the epitaxial source/drain regions 112 may include materials exerting a compressive strain in the channel regions, such as SiGe, SiGeB, Ge, GeSn, or the like. The epitaxial source/drain regions 112 may have surfaces raised from respective surfaces of the fins 90 and may have facets.

The epitaxial source/drain regions 112 and/or the fins 90 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 112 may be in situ doped during growth.

As a result of the epitaxy processes used to form the epitaxial source/drain regions 112, upper surfaces of the epitaxial source/drain regions 112 have facets which expand laterally outward beyond sidewalls of the fins 90. In the embodiment shown, these facets cause adjacent epitaxial source/drain regions 112 of a same GAA FET to merge, as illustrated. In other embodiments (not shown), adjacent epitaxial source/drain regions 112 remain separated after the epitaxy process is completed.

Figure 19:
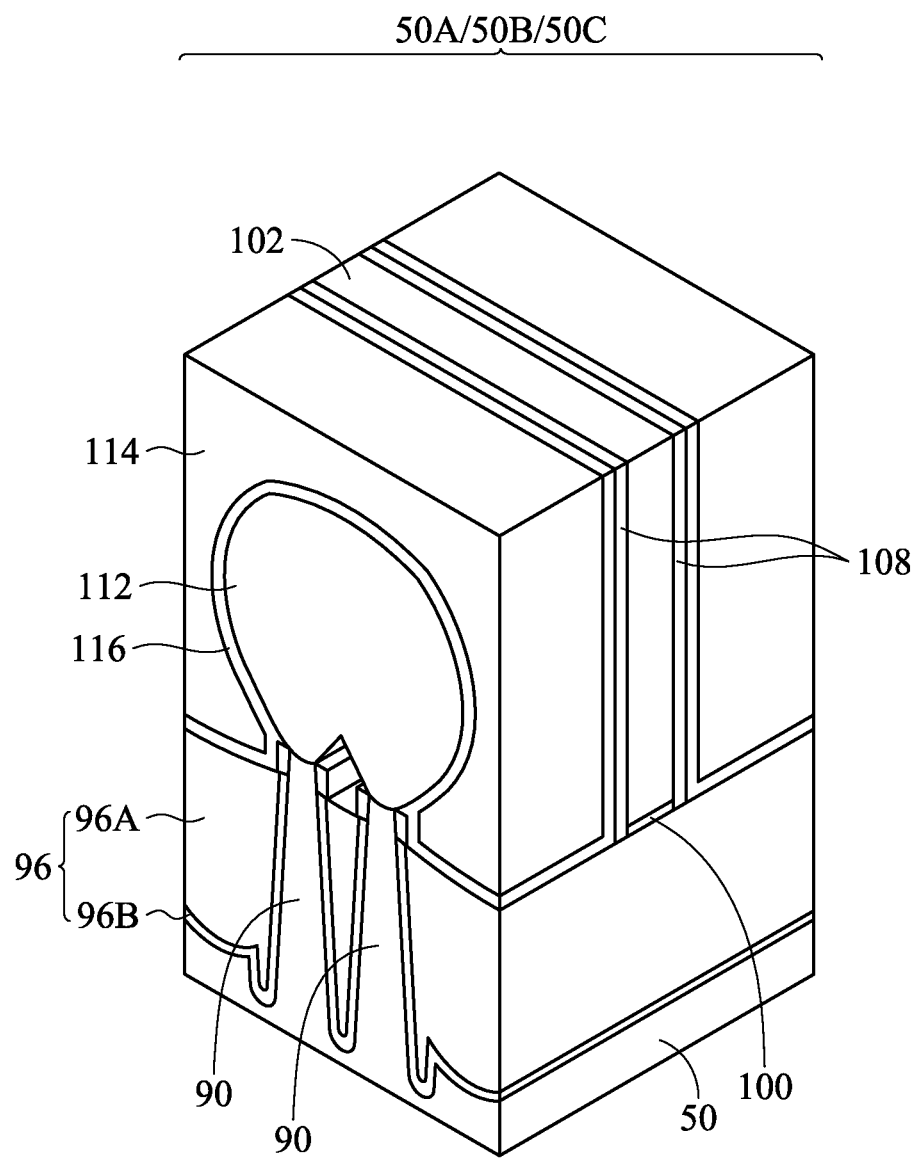

In FIG. 19, a first inter-layer dielectric (ILD) 114 is deposited over the intermediate structure illustrated. The first ILD 114 may be formed of a dielectric material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be used. In some embodiments, a contact etch stop layer (CESL) 116 is disposed between the first ILD 114 and the epitaxial source/drain regions 112, gate spacers 108, and STI regions 96. The CESL 116 may comprise a dielectric material, such as, silicon nitride, silicon oxide, silicon oxynitride, or the like, having a different etch rate than the material of the overlying first ILD 114.

Further, a planarization process, such as a CMP, may be performed to level the top surfaces of the first ILD 114 and CESL 116 with the top surfaces of the dummy gates 102 and gate spacers 108. The planarization process may also remove the masks 104 on the dummy gates 102, and portions of the gate spacers 108 along sidewalls of the masks 104. After the planarization process, top surfaces of the dummy gates 102, gate spacers 108, and first ILD 114 are level. Accordingly, the top surfaces of the dummy gates 102 are exposed through the first ILD 114.

Figure 20:
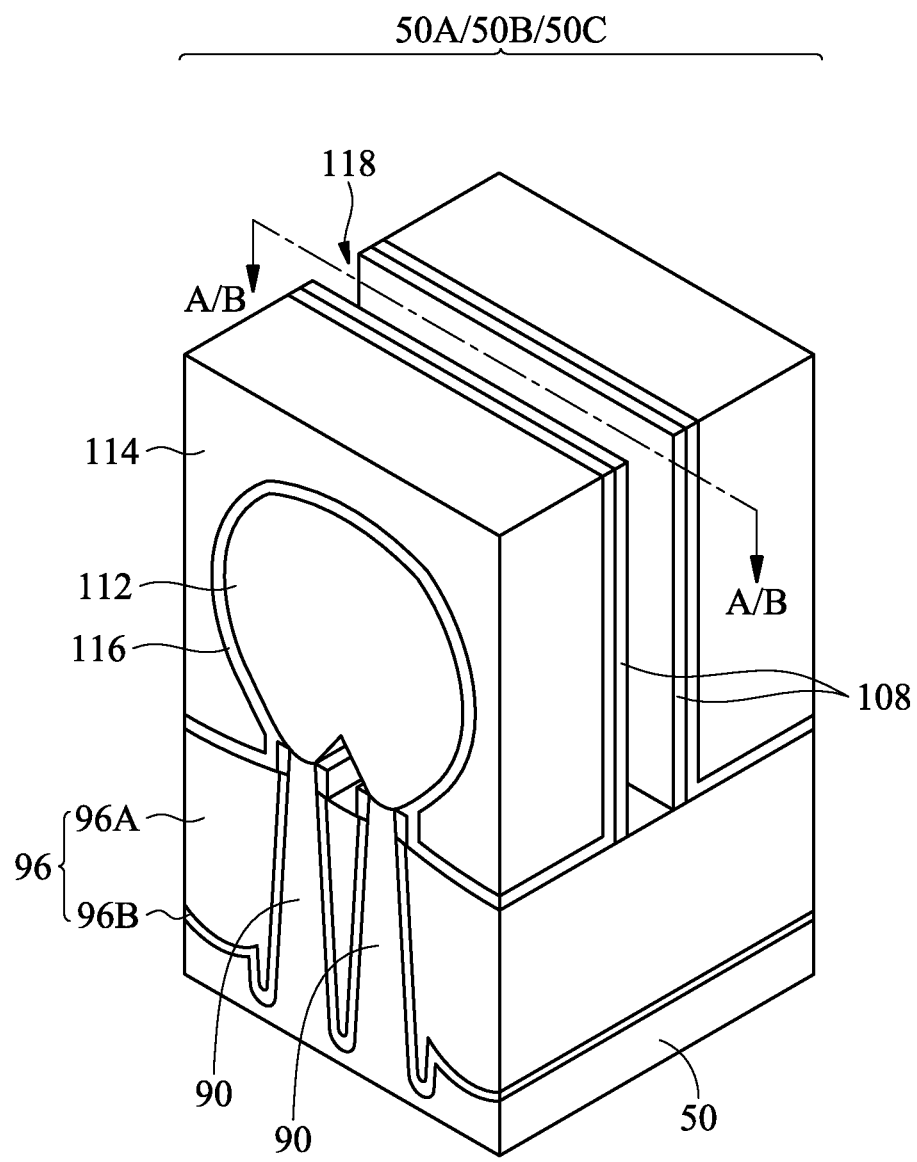
Figure 21:
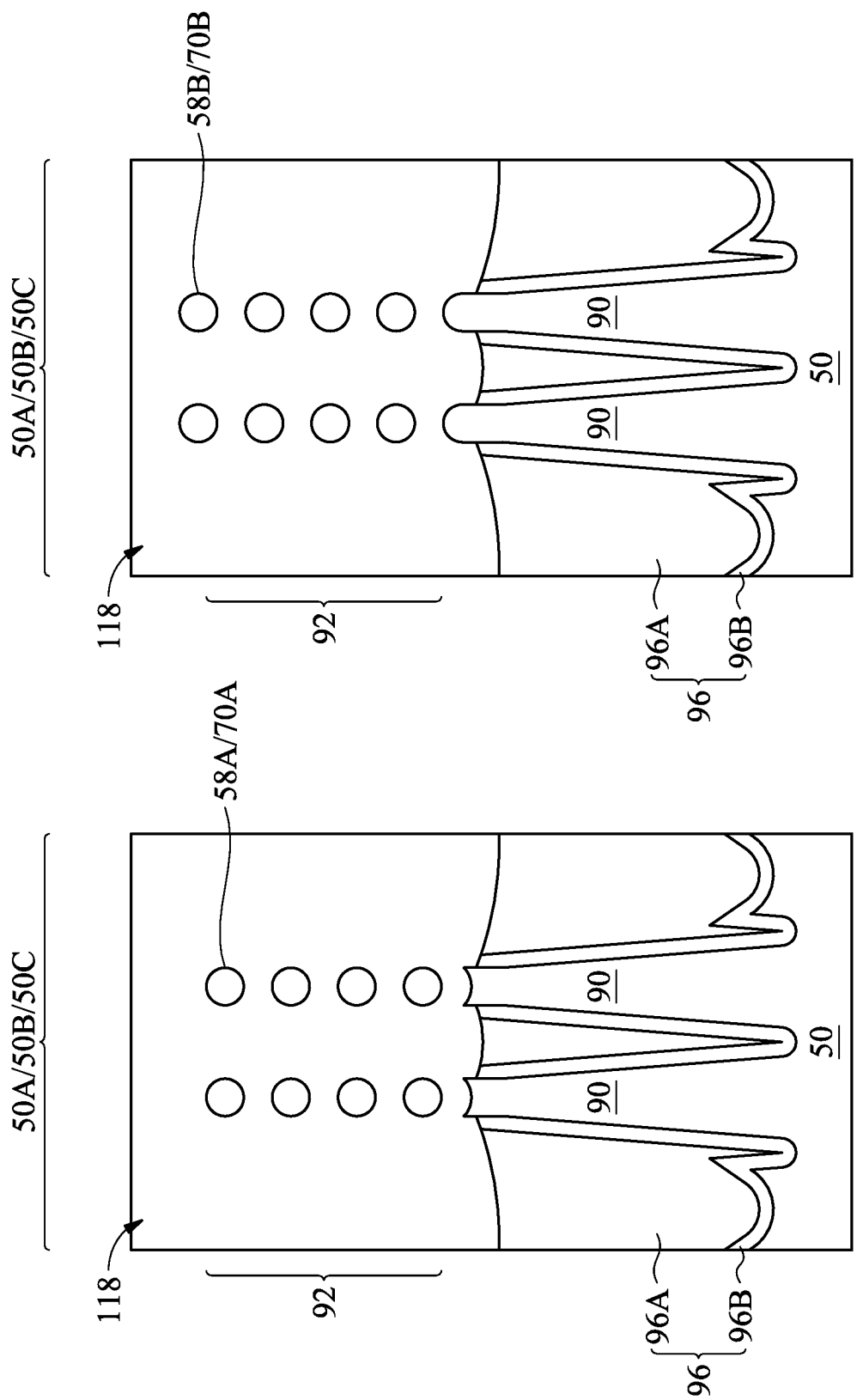

In FIG. 20, the dummy gates 102 are removed in an etching step(s), so that recesses 118 are formed. Portions of the dummy dielectric 100 in the recesses 118 may also be removed. In some embodiments, the dummy dielectric 100 is removed from recesses 118 in a first region of a die (e.g., a core logic region) and remains in recesses 118 in a second region of the die (e.g., an input/output region). In some embodiments, the dummy gates 102 are removed by an anisotropic dry etch process. For example, the etching process may include a dry etch process using reaction gas(es) that selectively etch the dummy gates 102 without etching the first ILD 114 or the gate spacers 108. Each recess 118 exposes a channel region of a respective GAA structure 92. Each channel region is disposed between neighboring pairs of the epitaxial source/drain regions 112. During the removal, the dummy dielectric 100 may be used as an etch stop layer when the dummy gates 102 are etched. The dummy dielectric 100 may then be optionally removed after the removal of the dummy gates 102.

After removal of the dummy gates 102 and dummy dielectric 100, appropriate portions of the GAA stacks 92 are removed. When p-type FETs are formed (see FIG. 21A), the second semiconductor layers 58B are removed from the GAA stacks 92, leaving the first semiconductor layers 58A as the channel regions of the p-type FETs. When n-type FETs are formed (see FIG. 21B), the first semiconductor layers 58A are removed from the GAA stacks 92, leaving the second semiconductor layers 58B as the channel regions of the n-type FETs. The removal may be by an appropriate etching, such as an anisotropic wet etch selective to the desired material (e.g., silicon germanium when the first semiconductor layers 58A are removed, silicon when the second semiconductor layers 58B are removed). The GAA stacks 92 may be etched in a different process than the process for forming the recesses 118, or may be etched in a same process.

Figure 22:
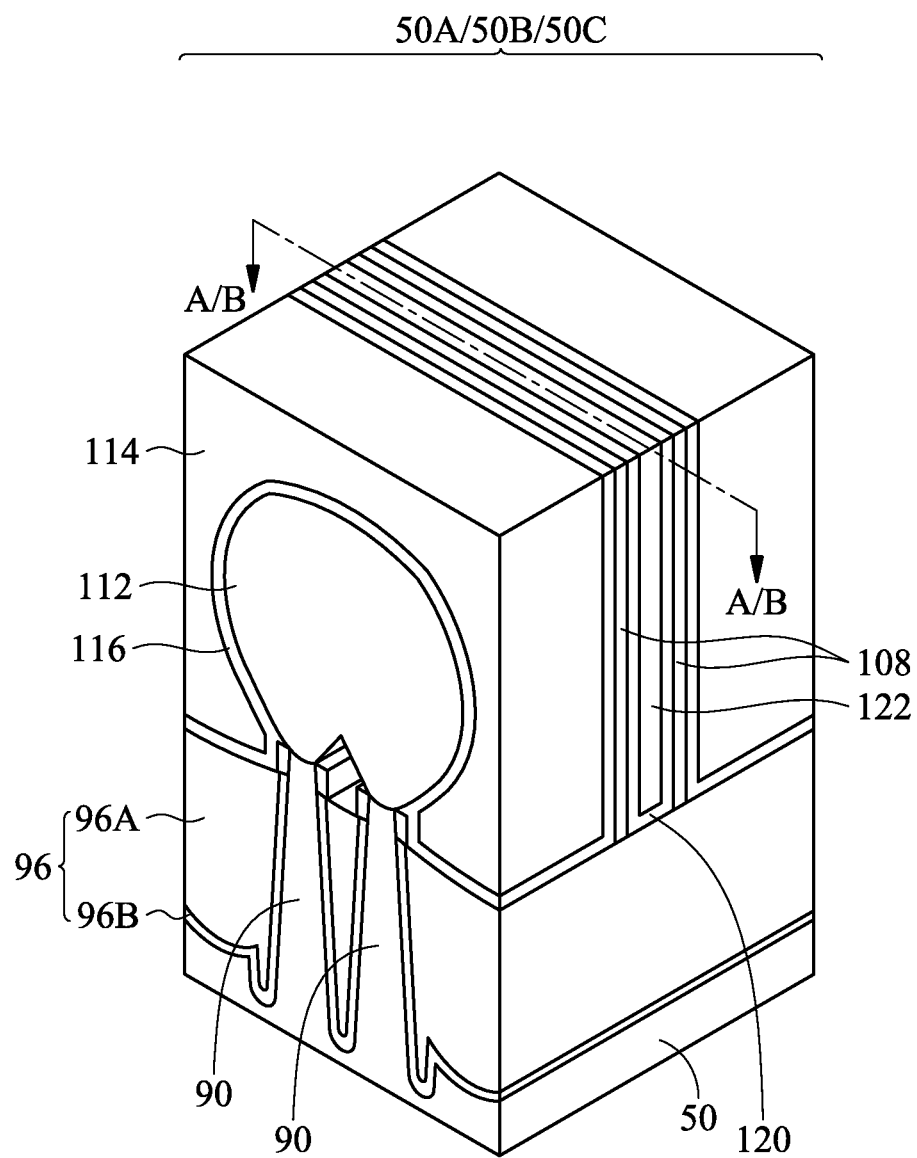
Figure 23:
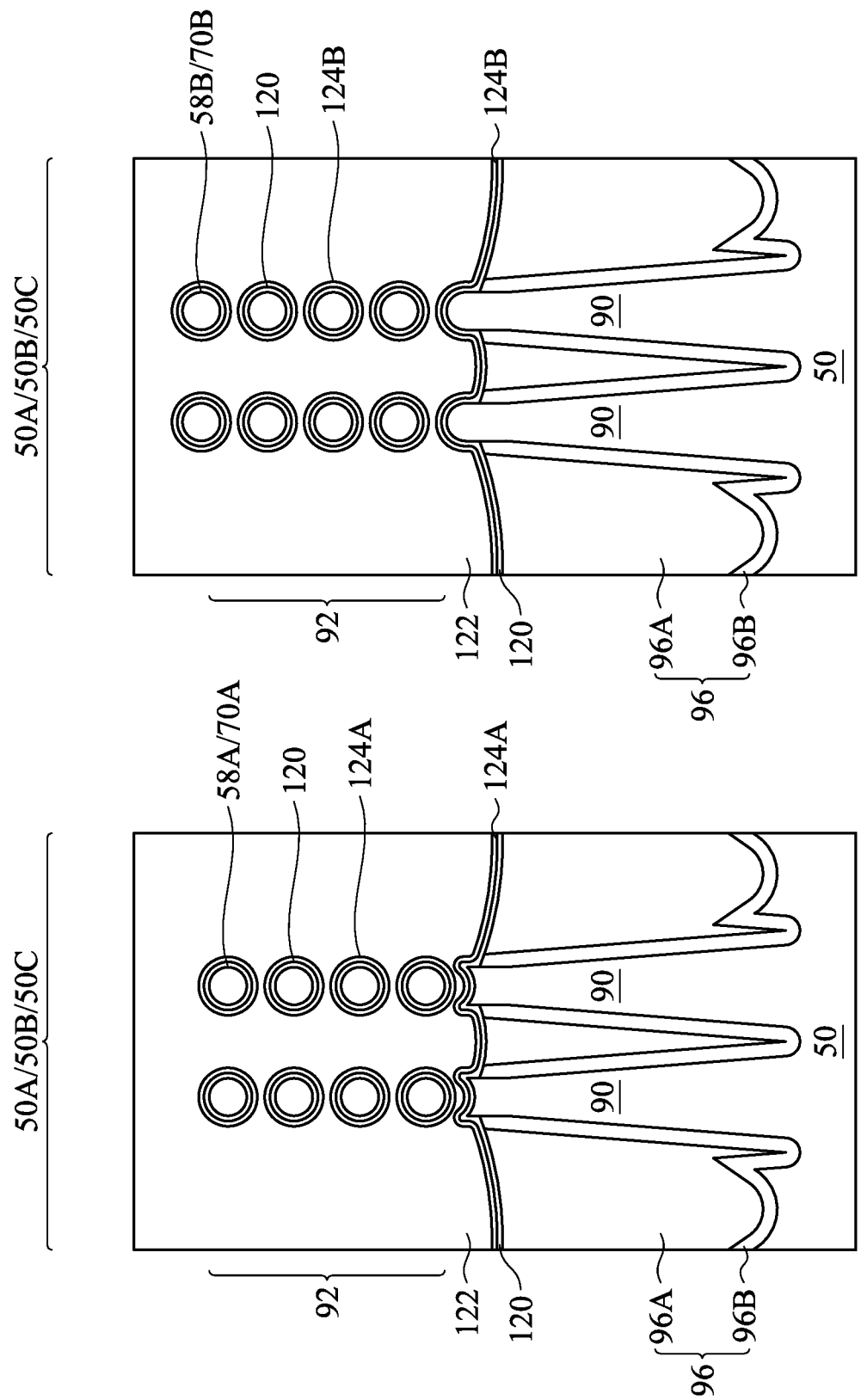

In FIG. 22, gate dielectric layers 120 and gate electrodes 122 are formed for replacement gates. The gate dielectric layers 120 are deposited conformally in the recesses 118, such as on the top surfaces and the sidewalls of the fins 90, and on sidewalls of the gate spacers 108. The gate dielectric layers 120 may also be formed on top surface of the first ILD 114. Notably, the gate dielectric layers 120 wrap around the remaining horizontal nanowires of the GAA stacks 92. When p-type FETs are formed (see FIG. 23A), the gate dielectric layers 120 wrap around the remaining first semiconductor layers 58A and 70A (e.g., the nanowires of the p-type GAA FETs). When n-type FETs are formed (see FIG. 23B), the gate dielectric layers 120 wrap around the remaining second semiconductor layers 58B and 70B (e.g., the nanowires of the n-type GAA FETs). In accordance with some embodiments, the gate dielectric layers 120 comprise silicon oxide, silicon nitride, or multilayers thereof. In some embodiments, the gate dielectric layers 120 include a high-k dielectric material, and in these embodiments, the gate dielectric layers 120 may have a k value greater than about 7.0, and may include a metal oxide or a silicate of Hf, Al, Zr, La, Mg, Ba, Ti, Pb, and combinations thereof. The formation methods of the gate dielectric layers 120 may include Molecular-Beam Deposition (MBD), ALD, PECVD, and the like. In embodiments where portions of the dummy dielectrics 100 remain in the recesses 118, the gate dielectric layers 120 include a material of the dummy dielectrics 100 (e.g., $SiO_2$).

The gate electrodes 122 are deposited over and around the gate dielectric layers 120, and fill the remaining portions of the recesses 118. The gate electrodes 122 may include a metal-containing material such as TiN, TiO, TaN, TaC, Co, Ru, Al, W, combinations thereof, or multi-layers thereof. For example, although a single layer gate electrode 122 is illustrated, the gate electrode 122 may comprise any number of liner layers, any number of work function tuning layers (discussed below), and a fill material. After the filling of the gate electrodes 122, a planarization process, such as a CMP, may be performed to remove the excess portions of the gate dielectric layers 120 and the material of the gate electrodes 122, which excess portions are over the top surface of the first ILD 114. The remaining portions of material of the gate electrodes 122 and the gate dielectric layers 120 thus form replacement gates of the resulting GAA FETs. Each gate electrode 122 and corresponding gate dielectric layers 120 may be collectively referred to as a "gate stack." Each gate stack extends around the nanowires formed from patterning the GAA structures 92.

In some embodiments, the work function tuning layers are different for n-type and p-type devices. When p-type FETs are formed (see FIG. 23A), a first set of work function tuning layers 124A is formed around each gate dielectric layer 120. When n-type FETs are formed (see FIG. 23B), a second set of work function tuning layers 124B is formed around each gate dielectric layer 120. The first set of work function tuning layers 124A includes different work function metals than the second set of work function tuning layers 124B. For example, the first set of work function tuning layers 124A may include TiN, TaN, or Mo, and the second set of work function tuning layers 124B may include WN, Ta, or Ti. The selected work function tuning layer materials modify the threshold voltages of the resulting GAA FETs. Because the GAA structures 92 have three initial threshold voltages ($V_1$, $V_2$, and $V_3$) and there are two sets of work function tuning layer materials (n-type and p-type) to choose from, the resulting GAA FETs may have one of six possible threshold voltages.

Figure 24:
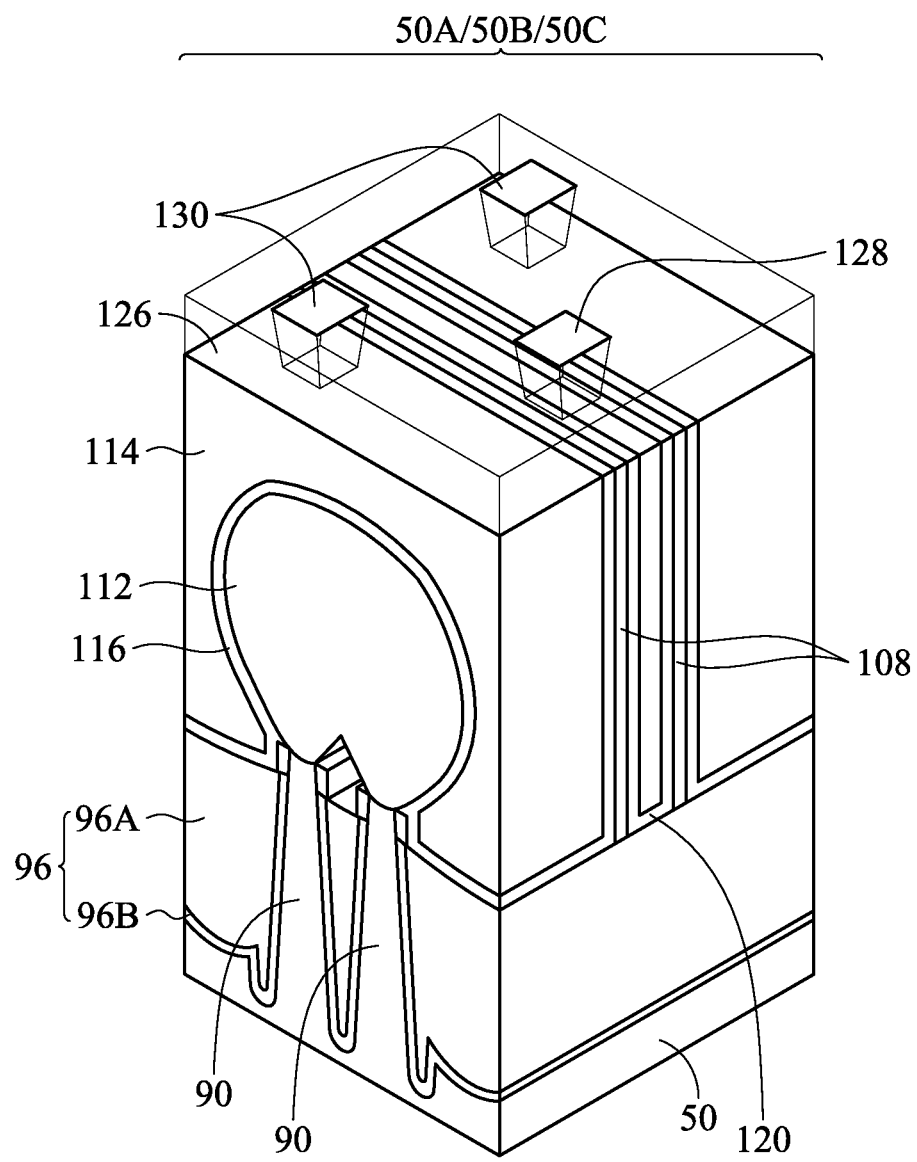

In FIG. 24, a second ILD 126 is deposited over the first ILD 114. In some embodiment, the second ILD 126 is a flowable film formed by a flowable CVD method. In some embodiments, the second ILD 126 is formed of a dielectric material such as PSG, BSG, BPSG, USG, or the like, and may be deposited by any suitable method, such as CVD and PECVD. In some embodiments, a gate mask (not shown) is formed over the gate stacks before the second ILD 126 is formed.

Further, gate contacts 128 and source/drain contacts 130 are formed through the second ILD 126 and first ILD 114 in accordance with some embodiments. Openings for the source/drain contacts 130 are formed through the first ILD 114 and second ILD 126, and openings for the gate contact 128 are formed through the second ILD 126 (and optionally the gate mask). The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a top surface of the second ILD 126. The remaining liner and conductive material form the source/drain contacts 130 and gate contacts 128 in the openings. An anneal process may be performed to form a silicide at the interface between the epitaxial source/drain regions 112 and the source/drain contacts 130. The source/drain contacts 130 are physically and electrically coupled to the epitaxial source/drain regions 112, and the gate contacts 128 are physically and electrically coupled to the gate electrodes 122. The source/drain contacts 130 and gate contacts 128 may be formed in different processes, or may be formed in the same process. Although some are shown as being formed in the same cross-sections, it should be appreciated that each of the source/drain contacts 130 and gate contacts 128 may be formed in different cross-sections, which may avoid shorting of the contacts.

Figure 25A:
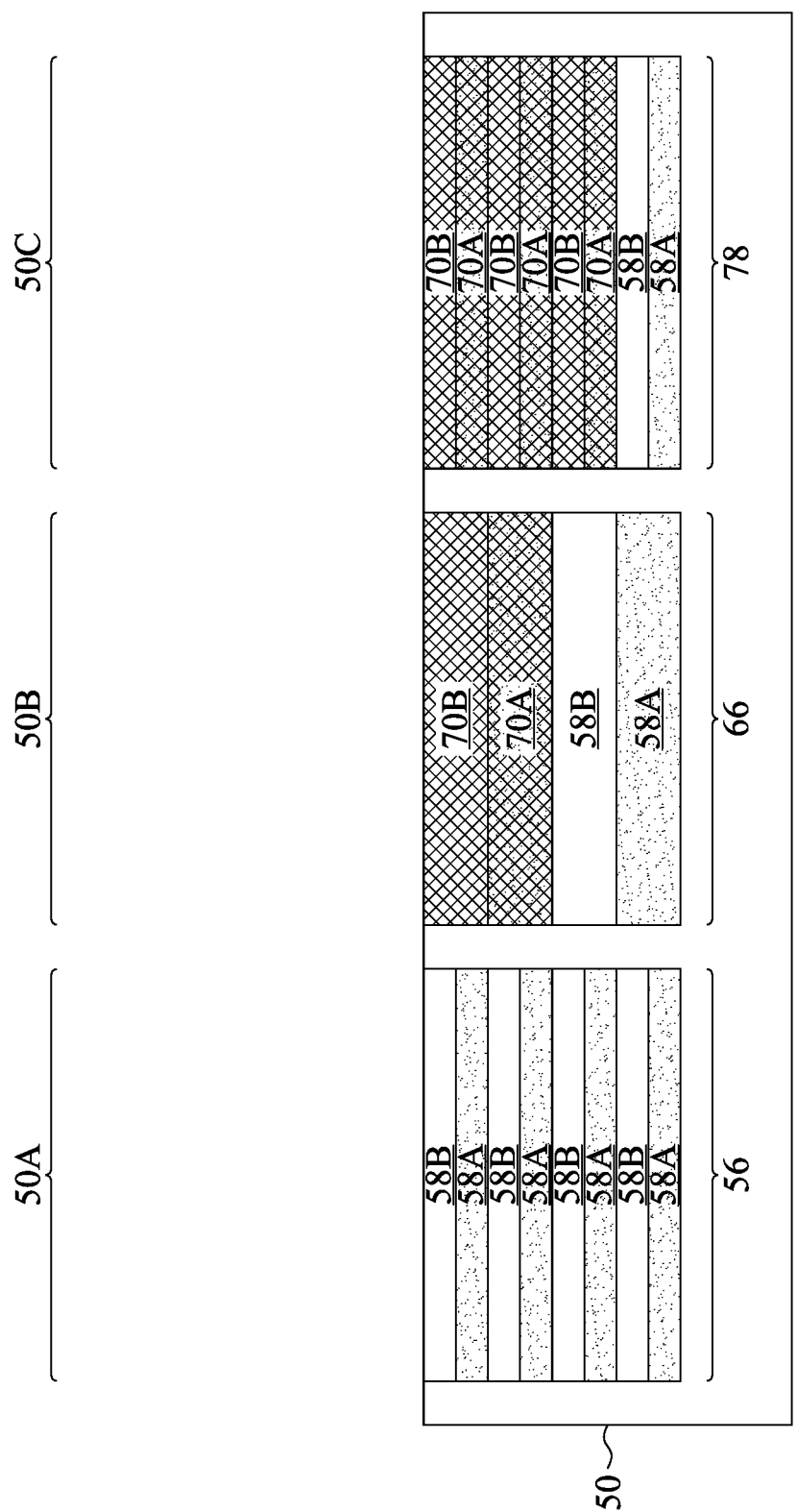

FIGS. 25A, 25B, and 25C are cross-sectional view showing intermediate stages in the manufacturing of GAA FETs, in accordance with some other embodiments. As discussed above, the concentrations of impurities in a channel region refers to an average impurity concentration. FIG. 25A shows an embodiment where some epitaxial material stacks, such as the epitaxial material stacks 66, include half as many layers as other stacks, but have layers with twice the thickness of other stacks, and thus have the same average impurity concentration as the epitaxial material stacks 66 of FIG. 12. The GAA structures in the region 50B may thus be formed with less epitaxy steps, which may reduce manufacturing costs. FIGS. 25B and 25C show cross-sectional views of resulting GAA FETs in the region 50B. Both the p-type (see FIG. 25B) and n-type (see FIG. 25C) devices have larger nanowires in their channel regions, which may accommodate higher channel currents.

Embodiments may achieve advantages. Forming multiple epitaxial material stacks with doped and undoped regions may allow GAA FETs with different threshold voltages to be formed on a same substrate. Using different work function materials for n-type and p-type devices may also increase the quantity of possible different threshold voltages.

In an embodiment, a method includes: forming a first recess and a second recess in a substrate; growing a first epitaxial material stack in the first recess, the first epitaxial material stack including alternating layers of a first semiconductor material and a second semiconductor material, the layers of the first epitaxial material stack being undoped; growing a second epitaxial material stack in the second recess, the second epitaxial material stack including alternating layers of the first semiconductor material and the second semiconductor material, a first subset of the second epitaxial material stack being undoped, a second subset of the second epitaxial material stack being doped; patterning the first epitaxial material stack and the second epitaxial material stack to respectively form first nanowires and second nanowires; and forming a first gate structure around the first nanowires and a second gate structure around the second nanowires.

In some embodiments of the method, the first semiconductor material is silicon germanium and the second semiconductor material is silicon, where layers of silicon germanium in the second subset of the second epitaxial material stack are doped with a Group V element, and where layers of silicon in the second subset of the second epitaxial material stack are doped with a Group III element. In some embodiments of the method, forming the first gate structure includes depositing a first metal around the first nanowires, and where forming the second gate structure includes depositing a second metal around the second nanowires, the second metal being different from the first metal. In some embodiments, the method further includes: forming a third recess in the substrate; growing a third epitaxial material stack in the third recess, the third epitaxial material stack including alternating layers of the first semiconductor material and the second semiconductor material, a first subset of the third epitaxial material stack being undoped, a second subset of the third epitaxial material stack being doped, the second subset of the third epitaxial material stack including more layer than the second subset of the second epitaxial material stack; patterning the third epitaxial material stack to form third nanowires; and forming a third gate structure around the third nanowires. In some embodiments of the method, growing the first epitaxial material stack includes: growing the first epitaxial material stack with a first epitaxial growth process. In some embodiments of the method, growing the second epitaxial material stack includes: growing the first subset of the second epitaxial material stack with the first epitaxial growth process; and growing the second subset of the second epitaxial material stack with a second epitaxial growth process, the second epitaxial growth process being different from the first epitaxial growth process. In some embodiments of the method, growing the third epitaxial material stack includes: growing the first subset of the third epitaxial material stack with the first epitaxial growth process; and growing the second subset of the third epitaxial material stack with the second epitaxial growth process. In some embodiments of the method, patterning the first epitaxial material stack includes: etching trenches in the first epitaxial material stack to form a first gate-all-around (GAA) structure including alternating layers of the first semiconductor material and the second semiconductor material; forming first gate spacers over the first GAA structure; and etching portions of the first GAA structure between the first gate spacers, the etching selectively removing the layers of the first semiconductor material, remaining layers of the second semiconductor material forming the first nanowires. In some embodiments, the method further includes: planarizing the substrate such that top surfaces of the second epitaxial material stack, the first epitaxial material stack, and the substrate are level.

In an embodiment, a method includes: growing a first epitaxial material stack in a substrate, the first epitaxial material stack having a first average impurity concentration; growing a second epitaxial material stack in the substrate, the second epitaxial material stack having a second average impurity concentration; growing a third epitaxial material stack in the substrate, the third epitaxial material stack having a third average impurity concentration, the first average impurity concentration, the second average impurity concentration, and the third average impurity concentration being different; planarizing the substrate such that top surfaces of the first epitaxial material stack, the second epitaxial material stack, and the third epitaxial material stack are level; patterning the first epitaxial material stack, the second epitaxial material stack, and the third epitaxial material stack to respectively form first nanowires, second nanowires, and third nanowires; and forming a first gate structure around the first nanowires, a second gate structure around the second nanowires, and a third gate structure around the third nanowires.

In some embodiments of the method, the first epitaxial material stack, the second epitaxial material stack, and the third epitaxial material stack have the same quantity of layers. In some embodiments of the method, the first epitaxial material stack and the third epitaxial material stack have a first quantity of layers, and the second epitaxial material stack has a second quantity of layers, the second quantity being different from the first quantity.

In an embodiment, a device includes: a first transistor including first nanowires and a first gate structure around the first nanowires, the first nanowires having a first average impurity concentration, the first gate structure including a first set of work function tuning layers; a second transistor including second nanowires and a second gate structure around the second nanowires, the second nanowires having a second average impurity concentration, the second average impurity concentration being different from the first average impurity concentration, the second gate structure including the first set of work function tuning layers; a third transistor including third nanowires and a third gate structure around the third nanowires, the third nanowires having the first average impurity concentration, the third gate structure including a second set of work function tuning layers; and a fourth transistor including fourth nanowires and a fourth gate structure around the fourth nanowires, the fourth nanowires having the second average impurity concentration, the fourth gate structure including the second set of work function tuning layers, the second set of work function tuning layers being different from the first set of work function tuning layers.

In some embodiments of the device, the first transistor, the second transistor, the third transistor, and the fourth transistor each have the same quantity of nanowires. In some embodiments of the device, the first transistor and the third transistor have a first quantity of nanowires, and the second transistor and the fourth transistor have a second quantity of nanowires, the second quantity being different from the first quantity. In some embodiments of the device, the first transistor and the second transistor are p-type gate-all-around (GAA) field-effect transistors (FETs), and where the third transistor and the fourth transistor are n-type GAA FETs. In some embodiments of the device, the first nanowires include undoped silicon germanium, a first subset of the second nanowires include undoped silicon germanium, and a second subset of the second nanowires include silicon germanium doped with a Group V impurity. In some embodiments of the device, the first set of work function tuning layers includes TiN, TaN, or Mo. In some embodiments of the device, the third nanowires include undoped silicon, a first subset of the fourth nanowires include undoped silicon, and a second subset of the fourth nanowires include silicon doped with a Group III impurity. In some embodiments of the device, the second set of work function tuning layers includes WN, Ta, or Ti.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first transistor comprising first nanowires and a first gate structure around the first nanowires, the first nanowires having a first average impurity concentration, the first gate structure comprising a first p-type work function tuning layer;
   a second transistor comprising second nanowires and a second gate structure around the second nanowires, the second nanowires having a second average impurity concentration, the second average impurity concentration being different from the first average impurity concentration, the second gate structure comprising a second p-type work function tuning layer;
   a third transistor comprising third nanowires and a third gate structure around the third nanowires, the third nanowires having a third average impurity concentration, the third gate structure comprising a first n-type work function tuning layer; and
   a fourth transistor comprising fourth nanowires and a fourth gate structure around the fourth nanowires, the fourth nanowires having a fourth average impurity concentration, the fourth average impurity concentration being different from the third average impurity concentration, the fourth gate structure comprising a second n-type work function tuning layer.

2. The device of claim 1, wherein the first transistor, the second transistor, the third transistor, and the fourth transistor each have the same quantity of nanowires.

3. The device of claim 1, wherein the first transistor and the third transistor have a first quantity of nanowires, and the second transistor and the fourth transistor have a second quantity of nanowires, the second quantity of nanowires being different from the first quantity of nanowires.

4. The device of claim 1, wherein the first transistor, the second transistor, the third transistor, and the fourth transistor are gate-all-around (GAA) field-effect transistors (FETs).

5. The device of claim 1, wherein the first nanowires comprise undoped silicon germanium, a first subset of the second nanowires comprise undoped silicon germanium, and a second subset of the second nanowires comprise silicon germanium doped with a Group V impurity.

6. The device of claim 5, wherein the first p-type work function tuning layer and the second p-type work function tuning layer comprise TiN, TaN, or Mo.

7. The device of claim 1, wherein the third nanowires comprise undoped silicon, a first subset of the fourth nanowires comprise undoped silicon, and a second subset of the fourth nanowires comprise silicon doped with a Group III impurity.

8. The device of claim 7, wherein the first n-type work function tuning layer and the second n-type work function tuning layer comprise WN, Ta, or Ti.

9. A device comprising:
   a first channel region over a substrate, the first channel region comprising a first semiconductor material;
   a second channel region over the first channel region, the second channel region comprising the first semiconductor material and being doped with a first impurity, the second channel region having a greater concentration of the first impurity than the first channel region;
   a gate dielectric around the first channel region and the second channel region; and
   a gate electrode around the gate dielectric.

10. The device of claim 9, wherein the first semiconductor material is silicon germanium and the first impurity is a Group V impurity.

11. The device of claim 10, wherein the gate electrode comprises a p-type work function tuning layer.

12. The device of claim 9, wherein the first semiconductor material is silicon and the first impurity is a Group III impurity.

13. The device of claim 12, wherein the gate electrode comprises an n-type work function tuning layer.

14. The device of claim 9 further comprising:
a source/drain region adjoining the first channel region and the second channel region.

15. A device comprising:
a first transistor comprising:
first nanowires over a substrate, the first nanowires comprising a first semiconductor material, a first subset of the first nanowires being undoped, a second subset of the first nanowires being doped with a first impurity; and
a first gate structure wrapped around the first nanowires; and
a second transistor comprising:
second nanowires over the substrate, the second nanowires comprising the first semiconductor material, a first subset of the second nanowires being undoped, a second subset of the second nanowires being doped with the first impurity, the second subset of the second nanowires including more nanowires than the second subset of the first nanowires; and
a second gate structure wrapped around the second nanowires.

16. The device of claim 15, wherein the first semiconductor material is silicon germanium and the first impurity is a Group V impurity.

17. The device of claim 16, wherein the first gate structure and the second gate structure comprise p-type work function tuning layers.

18. The device of claim 15, wherein the first semiconductor material is silicon and the first impurity is a Group III impurity.

19. The device of claim 18, wherein the first gate structure and the second gate structure comprise n-type work function tuning layers.

20. The device of claim 15, wherein the first nanowires and the second nanowires have the same quantity of nanowires.

* * * * *